US012165553B2

United States Patent
In et al.

(10) Patent No.: US 12,165,553 B2
(45) Date of Patent: Dec. 10, 2024

(54) GATE DRIVER INCLUDING PULL-UP CIRCUIT AND PULL-DOWN CIRCUIT AND DISPLAY APPARATUS INCLUDING THE SAME

(71) Applicant: Samsung Display Co., LTD., Yongin-si (KR)

(72) Inventors: Hai-Jung In, Seoul (KR); Chulkyu Kang, Suwon-si (KR); Kimyeong Eom, Suwon-si (KR); Soon-Gi Kwon, Suwon-si (KR); Min Jeong Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/095,097

(22) Filed: Jan. 10, 2023

(65) Prior Publication Data
US 2023/0360573 A1    Nov. 9, 2023

(30) Foreign Application Priority Data
May 4, 2022 (KR) .................... 10-2022-0055351

(51) Int. Cl.
G09G 3/20 (2006.01)
(52) U.S. Cl.
CPC ....... *G09G 3/20* (2013.01); *G09G 2310/0267* (2013.01); *G09G 2310/0291* (2013.01); *G09G 2310/08* (2013.01); *G09G 2320/0214* (2013.01); *G09G 2320/0247* (2013.01)

(58) Field of Classification Search
None
See application file for complete search history.

(56) References Cited

U.S. PATENT DOCUMENTS

| | | | |
|---|---|---|---|
| 10,453,386 B2 | 10/2019 | Jang | |
| 2017/0124970 A1* | 5/2017 | Li | G09G 3/3677 |
| 2021/0193050 A1* | 6/2021 | Yuan | G09G 3/3677 |
| 2022/0130309 A1* | 4/2022 | Wang | G09G 3/20 |
| 2024/0169924 A1* | 5/2024 | Shang | H01L 27/12 |

\* cited by examiner

*Primary Examiner* — Amr A Awad
*Assistant Examiner* — Donna V Bocar
(74) *Attorney, Agent, or Firm* — CANTOR COLBURN LLP

(57) ABSTRACT

A gate driver includes: a pull-up circuit configured to pull up a gate output signal to a high voltage in response to a signal at a first node of the pull-up circuit; a first pull-down circuit configured to pull down the gate output signal to a low voltage in response to a signal at a second node of the first pull-down circuit; a second pull-down circuit configured to pull down the gate output signal to the low voltage in response to a signal at a third node of the second pull-down circuit; a first selection circuit configured to activate the first pull-down circuit and deactivate the second pull-down circuit based on a first selection signal; and a second selection circuit configured to activate the second pull-down circuit and deactivate the first pull-down circuit based on a second selection signal.

33 Claims, 25 Drawing Sheets

GATE DRIVER INCLUDING PULL-UP CIRCUIT AND PULL-DOWN CIRCUIT AND DISPLAY APPARATUS INCLUDING THE SAME

This application claims priority to Korean Patent Application No. 10-2022-0055351, filed on May 4, 2022, and all the benefits accruing therefrom under 35 U.S.C. § 119, the content of which in its entirety is herein incorporated by reference.

BACKGROUND

1. Field

Embodiments of the present invention relate to a gate driver and a display apparatus including the gate driver. More particularly, embodiments of the present invention relate to a gate driver stably outputting a gate signal and a display apparatus including the gate driver.

2. Description of the Related Art

Generally, a display apparatus includes a display panel and a display panel driver. The display panel includes a plurality of gate lines, a plurality of data lines, a plurality of emission lines and a plurality of pixels. The display panel driver includes a gate driver, a data driver, an emission driver and a driving controller. The gate driver outputs gate signals to the gate lines. The data driver outputs data voltages to the data lines. The emission driver outputs emission signals to the emission lines. The driving controller controls the gate driver, the data driver and the emission driver.

The display panel and the display panel driver may include a P-type transistor or an N-type transistor. To prevent a current leakage, the display panel may include the N-type transistors only. When the display panel includes the N-type transistors only and the gate driver integrated on the display panel includes the P-type transistor, a manufacturing process may become complicated and a current leakage may occur in the gate driver.

In addition, a flicker may occur on the display panel due to the current leakage so that a display quality of the display panel may be deteriorated.

SUMMARY

Embodiments of the present invention provide a gate driver stably for outputting a gate signal.

Embodiments of the present invention provide a display apparatus including the gate driver.

In an embodiment of a gate driver according to the present invention, the gate driver includes: a pull-up circuit configured to pull up a gate output signal to a high voltage in response to a signal at a QF node, a first pull-down circuit configured to pull down the gate output signal to a low voltage in response to a signal at a QB1 node, a second pull-down circuit configured to pull down the gate output signal to the first low voltage in response to a signal at a QB2 node, a first selection circuit configured to activate the first pull-down circuit and deactivate the second pull-down circuit based on a first selection signal and a second selection circuit configured to activate the second pull-down circuit and deactivate the first pull-down circuit based on a second selection signal.

In an embodiment, the gate driver may further include: a carry pull-up circuit configured to pull up a carry signal to the high voltage in response to the signal at the QF node, a first carry pull-down circuit configured to pull down the carry signal to a second low voltage in response to the signal at the QB1 node, and a second carry pull-down circuit configured to pull down the carry signal to the second low voltage in response to the signal at the QB2 node.

In an embodiment, the carry pull-up circuit may include a seventh transistor including a control electrode connected to the QF node, an input electrode configured to receive the high voltage and an output electrode connected to a carry output terminal. The first carry pull-down circuit may include an eighth transistor including a control electrode connected to the QB1 node, an input electrode configured to receive the second low voltage and an output electrode connected to the carry output terminal. The second carry pull-down circuit may include a ninth transistor including a control electrode connected to the QB2 node, an input electrode configured to receive the second low voltage and an output electrode connected to the carry output terminal.

In an embodiment, the gate driver may further include a boosting circuit configured to boost the signal at the QF node using a second clock signal in response to the signal at the QF node.

In an embodiment, the boosting circuit may include a thirteenth transistor including a control electrode connected to the QF node, an input electrode configured to receive the second clock signal and an output electrode connected to a second electrode of a first capacitor and the first capacitor including a first electrode connected to the QF node and the second electrode.

In an embodiment, the gate driver may further include an input circuit configured to transmit an input signal to a Q node in response to a first clock signal.

In an embodiment, the input circuit may include an 1-1 transistor including a control electrode configured to receive the first clock signal, an input electrode configured to receive the input signal and an output electrode connected to a first intermediate node and an 1-2 transistor including a control electrode configured to receive the first clock signal, an input electrode connected to the first intermediate node and an output electrode connected to the Q node.

In an embodiment, the gate driver may further include a fourth transistor including a control electrode configured to receive the high voltage, an input electrode connected to the Q node and an output electrode connected to the QF node.

In an embodiment, the fourth transistor may further include a second control electrode configured to receive the high power voltage.

In an embodiment, the gate driver may further include a 4-1 transistor including a first control electrode configured to receive the first selection signal, an input electrode connected to the Q node, an output electrode connected to the QF node and a second control electrode configured to receive the first selection signal and a 4-2 transistor including a first control electrode configured to receive the second selection signal, an input electrode connected to the Q node, an output electrode connected to the QF node and a second control electrode configured to receive the second selection signal.

In an embodiment, the gate driver may further include a first Q node control circuit configured to apply a second low voltage to a Q node in response to the signal at the QB1 node.

In an embodiment, the first Q node control circuit may include a 2-1 transistor including a first control electrode connected to the QB1 node, an input electrode connected to a second intermediate node and an output electrode connected to the Q node and a 2-2 transistor including a first control electrode connected to the QB1 node, an input electrode configured to receive the second low voltage and an output electrode connected to the second intermediate node.

In an embodiment, the 2-1 transistor may further include a second control electrode connected to the QB1 node. The 2-2 transistor may further include a second control electrode configured to receive the second low voltage.

In an embodiment, the 2-1 transistor may further include a second control electrode connected to the QB1 node. The 2-2 transistor may further include a second control electrode connected to the QB1 node.

In an embodiment, the first Q node control circuit may include a 2-1 transistor including a first control electrode connected to the QB1 node, an input electrode connected to a 2-1 intermediate node, an output electrode connected to the Q node and a second control electrode connected to the QB1 node, a 2-2 transistor including a first control electrode connected to the QB1 node, an input electrode connected to a 2-2 intermediate node, an output electrode connected to the 2-1 intermediate node and a second control electrode connected to the QB1 node and a 2-3 transistor including a first control electrode connected to the QB1 node, an input electrode configured to receive the second low voltage, an output electrode connected to the 2-2 intermediate node and a second control electrode connected to the QB1 node.

In an embodiment, the gate driver may further include a second Q node control circuit configured to apply a second low voltage to a Q node in response to the signal at the QB2 node.

In an embodiment, the second Q node control circuit may include a 3-1 transistor including a first control electrode connected to the QB2 node, an input electrode connected to a third intermediate node and an output electrode connected to the Q node and a 3-2 transistor including a first control electrode connected to the QB2 node, an input electrode configured to receive the second low voltage and an output electrode connected to the third intermediate node.

In an embodiment, the 3-1 transistor may further include a second control electrode connected to the QB2 node. The 3-2 transistor may further include a second control electrode configured to receive the second low voltage.

In an embodiment, the 3-1 transistor may further include a second control electrode connected to the QB2 node. The 3-2 transistor may further include a second control electrode connected to the QB2 node.

In an embodiment, the first Q node control circuit may include a 3-1 transistor including a first control electrode connected to the QB2 node, an input electrode connected to a 3-1 intermediate node, an output electrode connected to the Q node and a second control electrode connected to the QB2 node, a 3-2 transistor including a first control electrode connected to the QB2 node, an input electrode connected to a 3-2 intermediate node, an output electrode connected to the 3-1 intermediate node and a second control electrode connected to the QB2 node and a 3-3 transistor including a first control electrode connected to the QB2 node, an input electrode configured to receive the second low voltage, an output electrode connected to the 3-2 intermediate node and a second control electrode connected to the QB2 node.

In an embodiment, the gate driver may further include a fifth transistor configured to apply a second low voltage to the QB1 node in response to a signal at a Q node.

In an embodiment, the gate driver may further include a sixth transistor configured to apply a second low voltage to the QB2 node in response to the signal at a Q node.

In an embodiment, the gate driver may further include a reset circuit configured to apply the first low voltage to a Q node in response to a reset signal.

In an embodiment, the reset circuit may include a 23-1 transistor including a control electrode configured to receive the reset signal, an input electrode configured to receive the first low voltage and an output electrode connected to a twenty third intermediate node and a 23-2 transistor including a control electrode configured to receive the reset signal, an input electrode connected to the twenty third intermediate node and an output electrode connected to the Q node.

In an embodiment, the pull-up circuit may include a tenth transistor including a control electrode connected to the QF node, an input electrode configured to receive the high voltage and an output electrode connected to a gate output terminal and a second capacitor connected to the control electrode of the tenth transistor and the output electrode of the tenth transistor.

In an embodiment, the first selection circuit may include a 14-1 transistor including a control electrode configured to receive the first selection signal, an input electrode configured to receive the first selection signal and an output electrode connected to a fourteenth intermediate node, a 14-2 transistor including a control electrode configured to receive the first selection signal, an input electrode connected to the fourteenth intermediate node and an output electrode connected to a control electrode of a fifteenth transistor, the fifteenth transistor including the control electrode connected to the output electrode of the 14-2 transistor, an input electrode configured to receive the first selection signal and an output electrode connected to an input electrode of a sixteenth transistor and the sixteenth transistor including a control electrode configured to receive a second clock signal, the input electrode connected to the output electrode of the fifteenth transistor and an output electrode connected to the QB1 node.

In an embodiment, the first selection circuit may further include a third capacitor including a first electrode connected to the control electrode of the fifteenth transistor and a second electrode connected to the QB1 node.

In an embodiment, the second selection circuit may include a 18-1 transistor including a control electrode configured to receive the second selection signal, an input electrode configured to receive the second selection signal and an output electrode connected to an eighteenth intermediate node, a 18-2 transistor including a control electrode configured to receive the second selection signal, an input electrode connected to the eighteenth intermediate node and an output electrode connected to a control electrode of a nineteenth transistor, the nineteenth transistor including the control electrode connected to the output electrode of the 18-2 transistor, an input electrode configured to receive the second selection signal and an output electrode connected to an input electrode of a twentieth transistor and the twentieth transistor including a control electrode configured to receive a second clock signal, the input electrode connected to the output electrode of the nineteenth transistor and an output electrode connected to the QB2 node.

In an embodiment, the second selection circuit may further include a fourth capacitor including a first electrode connected to the control electrode of the nineteenth transistor and a second electrode connected to the QB2 node.

In an embodiment, the gate driver may further include an 1-1 transistor including a control electrode configured to receive a first clock signal, an input electrode configured to receive an input signal and an output electrode connected to a first intermediate node, an 1-2 transistor including a control electrode configured to receive the first clock signal, an input electrode connected to the first intermediate node and an output electrode connected to a Q node, a 2-1 transistor including a control electrode connected to the QB1 node, an input electrode connected to a second intermediate node and an output electrode connected to the Q node, a 2-2 transistor including a control electrode connected to the QB1 node, an input electrode configured to receive a second low voltage and an output electrode connected to the second intermediate node, a 3-1 transistor including a control electrode connected to the QB2 node, an input electrode connected to a third intermediate node and an output electrode connected to the Q node, a 3-2 transistor including a control electrode connected to the QB2 node, an input electrode configured to receive the second low voltage, an output electrode connected to the third intermediate node and a stabilizing circuit configured to apply the high voltage to the first intermediate node, the second intermediate node and the third intermediate node in response to a signal at the Q node.

In an embodiment, the stabilizing circuit may include a 22-1 transistor including a control electrode connected to the Q node, an input electrode connected to a twenty second intermediate node and an output electrode connected to the first intermediate node, the second intermediate node and the third intermediate node and a 22-2 transistor including a control electrode connected to the Q node, an input electrode configured to receive the high voltage and an output electrode connected to the twenty second intermediate node.

In an embodiment, the gate driver may further include a boosting circuit configured to boost the signal at the QF node using a second clock signal in response to the signal at the QF node. The boosting circuit may include a thirteenth transistor including a control electrode connected to the QF node, an input electrode configured to receive the second clock signal and an output electrode connected to a second electrode of a first capacitor and the first capacitor including a first electrode connected to the QF node and the second electrode. The gate driver may further include a twenty fourth transistor configured to apply the first low voltage to the output electrode of the thirteenth transistor in response to a first clock signal.

In an embodiment, all of the transistors in the gate driver may be N-type transistors.

In an embodiment, the gate output signal may be configured to maintain the high voltage for two or more horizontal periods.

In an embodiment of a display apparatus according to the present invention, the display apparatus includes: a display panel including a pixel, a gate driver configured to output a gate signal to the pixel, a data driver configured to output a data voltage to the pixel and an emission driver configured to output an emission signal to the pixel. The gate driver includes a pull-up circuit configured to pull up a gate output signal to a high voltage in response to a signal at a QF node, a first pull-down circuit configured to pull down the gate output signal to a low voltage in response to a signal at a QB1 node, a second pull-down circuit configured to pull down the gate output signal to the low voltage in response to a signal at a QB2 node, a first selection circuit configured to activate the first pull-down circuit and deactivate the second pull-down circuit based on a first selection signal and a second selection circuit configured to activate the second pull-down circuit and deactivate the first pull-down circuit based on a second selection signal.

According to the gate driver and the display apparatus including the gate driver, all transistors in the gate driver may be configured as the N-type transistors. The gate driver may not include the P-type transistors but include the N-type transistors only.

To prevent the current leakage, the display panel includes the N-type transistors only and the gate driver integrated on the display panel also includes the N-type transistors only so that the manufacturing process may become simplified and the current leakage may be prevented in the gate driver. The flicker due to the current leakage may be prevented so that the display quality of the display panel may be effectively enhanced.

In addition, a deterioration of a driving capability of a transistor which outputs a low signal during most of frames may be prevented so that a reliability and a stability of a gate output signal may be effectively enhanced.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION

It will be understood that, although the terms "first," "second," "third," "1-1," "1-2," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, the present invention will be explained in detail with reference to the accompanying drawings.

Figure 1:
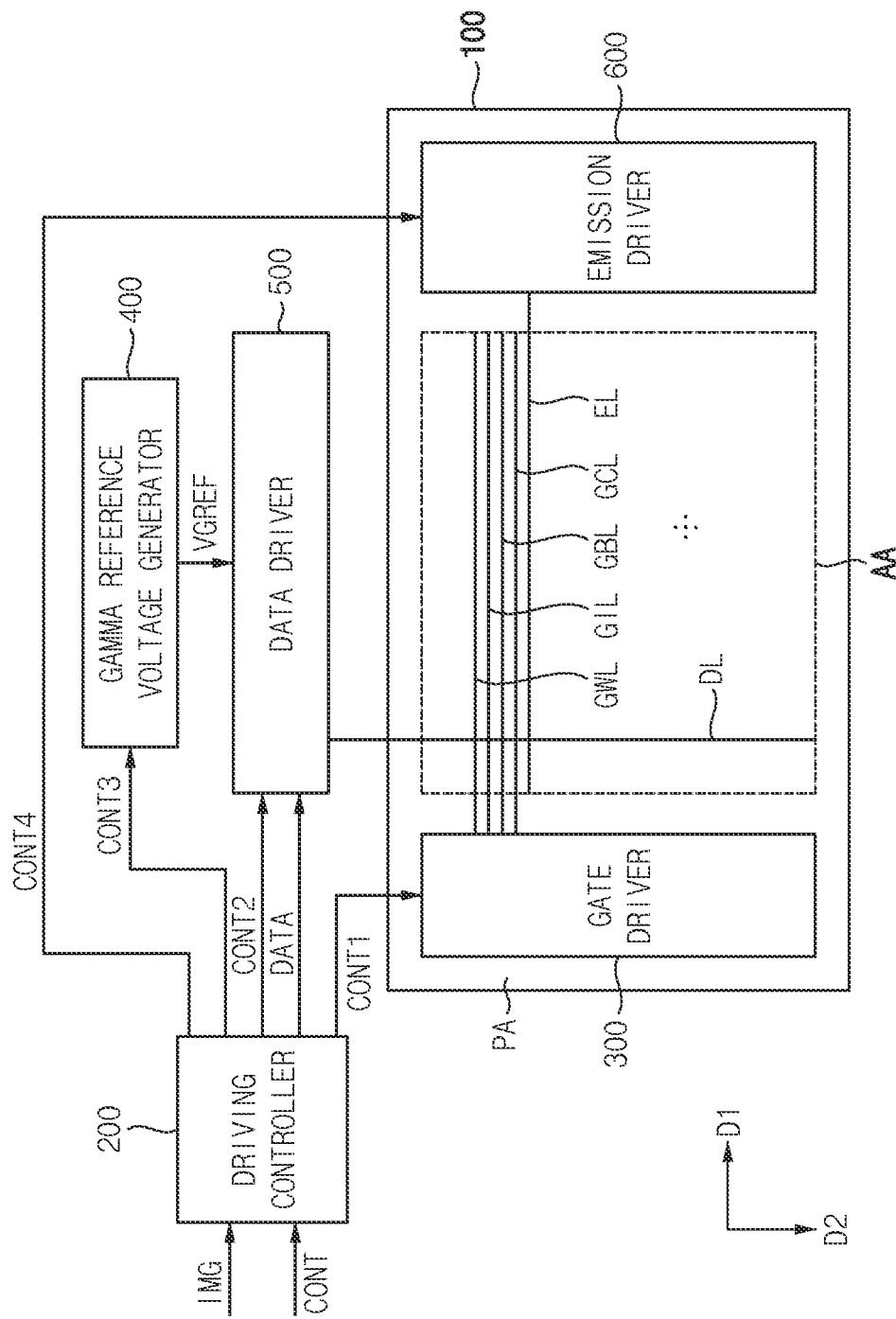
FIG. 1 is a block diagram illustrating a display apparatus according to an embodiment of the present invention.

FIG. 1 is a block diagram illustrating a display apparatus according to an embodiment of the present invention.

Referring to FIG. 1, the display apparatus includes a display panel 100 and a display panel driver. The display panel driver includes a driving controller 200, a gate driver 300, a gamma reference voltage generator 400, a data driver 500 and an emission driver 600.

The display panel 100 has a display region AA on which an image is displayed and a peripheral region PA adjacent to the display region AA.

The display panel 100 includes a plurality of gate lines GWL, GIL, GBL and GCL, a plurality of data lines DL, a plurality of emission lines EL and a plurality of pixels electrically connected to the gate lines GWL, GIL, GBL and GCL, the data lines DL and the emission lines EL. The gate lines GWL, GIL, GBL and GCL may extend in a first direction D1, the data lines DL may extend in a second direction D2 crossing the first direction D1 and the emission lines EL may extend in the first direction D1.

The driving controller 200 receives input image data IMG and an input control signal CONT from an external apparatus. For example, the input image data IMG may include red image data, green image data and blue image data. The input image data IMG may include white image data. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GIL, GBL and GCL in response to the first control signal CONT1 received from the driving controller 200. The gate driver 300 may output the gate signals to the gate lines GWL, GIL, GBL and GCL. For example, the gate driver 300 may be integrated on the peripheral region PA of the display panel 100. For example, the gate driver 300 may be mounted on the peripheral region PA of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF is used for converting the data signal DATA into the data voltage having an analog type.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signals DATA into the data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 may output the emission signals to the emission lines EL. For example, the emission driver 600 may be integrated on the peripheral region PA of the display panel 100. For example, the emission driver 600 may be mounted on the peripheral region PA of the display panel 100.

Although the gate driver 300 is disposed at a first side of the display panel 100 and the emission driver 600 is disposed at a second side of the display panel 100 opposite to the first side in FIG. 1 for convenience of explanation, the present invention may not be limited thereto. For example, both of the gate driver 300 and the emission driver 600 may be disposed at the first side of the display panel 100. For example, the gate driver 300 and the emission driver 600 may be integrally formed.

Figure 2:
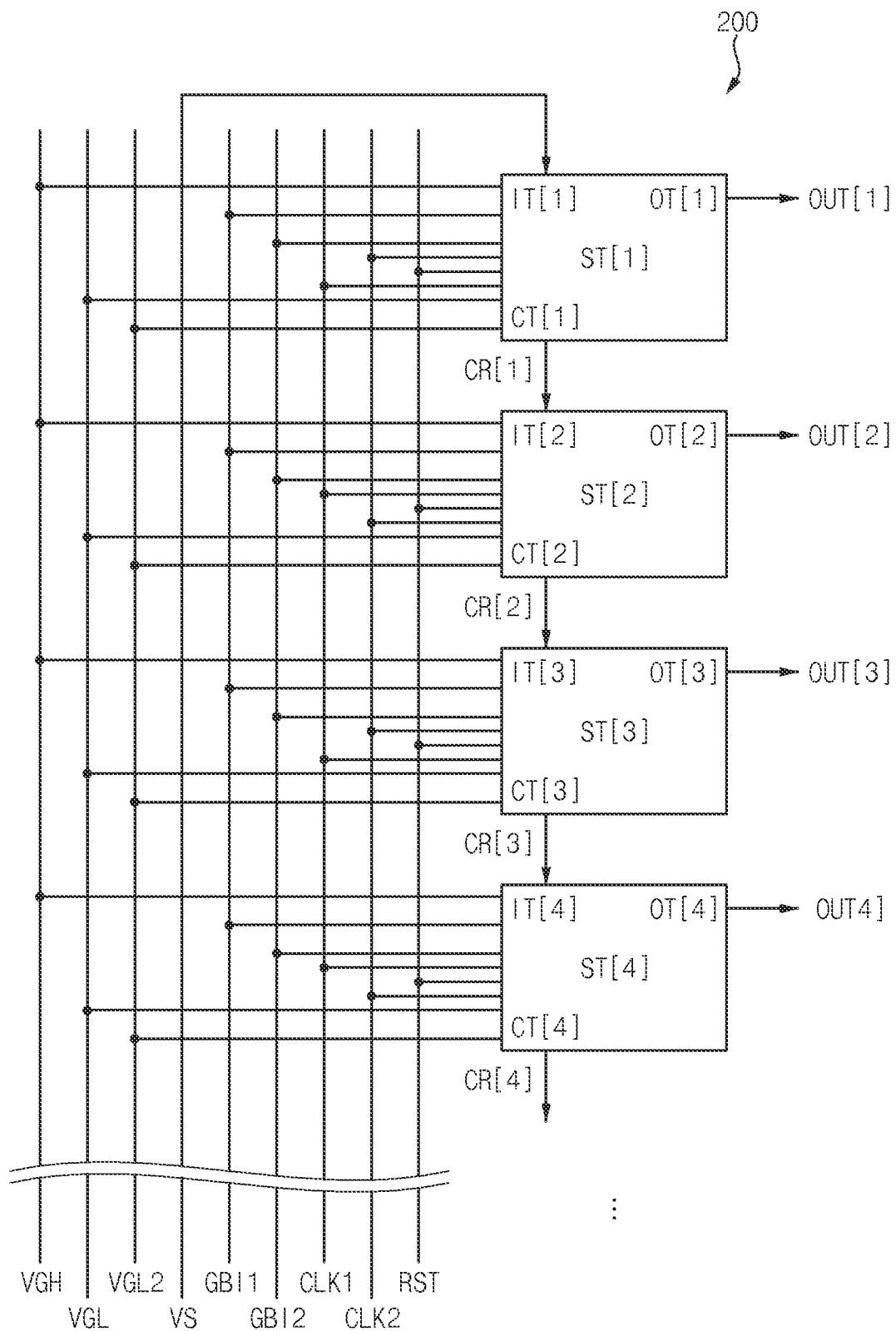
FIG. 2 is a block diagram illustrating a gate driver of FIG. 1.

FIG. 2 is a block diagram illustrating the gate driver 300 of FIG. 1.

Referring to FIGS. 1 and 2, in the present embodiment, a gate output signal outputted from the gate driver 300 may maintain a high voltage for two or more horizontal periods.

The gate driver 300 may include a plurality of stages ST[1], ST[2], ST[3] and ST[4].

A high voltage VGH, a first low voltage VGL, a second low voltage VGL2, a first selection signal GBI1, a second selection signal GBI2, a first clock signal CLK1 and a second clock signal CLK2 may be applied to the stages ST[1], ST[2], ST[3] and ST[4]. In addition, a reset signal RST may be applied to the stages ST[1], ST[2], ST[3] and ST[4].

For example, the second low voltage VGL2 may have a level lower than a level of the first low voltage VGL.

The first clock signal CLK1 and the second clock signal CLK2 may be alternately applied to the stages ST[1], ST[2], ST[3] and ST[4]. For example, the first clock signal CLK1 may be applied to a first clock terminal of a first stage ST[1], and the second clock signal CLK2 may be applied to a second clock terminal of the first stage ST[1]. In contrast, the second clock signal CLK2 may be applied to a first clock terminal of a second stage ST[2], and the first clock signal CLK1 may be applied to a second clock terminal of the second stage ST[2].

Like the first stage ST[1], the first clock signal CLK1 may be applied to a first clock terminal of a third stage ST[3], and the second clock signal CLK2 may be applied to a second clock terminal of the third stage ST[3]. Like the second stage ST[2], the second clock signal CLK2 may be applied to a first clock terminal of a fourth stage ST[4] and the first clock signal CLK1 may be applied to a second clock terminal of the fourth stage ST[4].

The vertical start signal VS may be applied to an input terminal IT[1] of the first stage ST[1]. A first carry signal CR[1] of the first stage ST[1] may be applied to an input terminal IT[2] of the second stage ST[2]. A second carry signal CR[2] of the second stage ST[2] may be applied to an input terminal IT[3] of the third stage ST[3]. A third carry signal CR[3] of the third stage ST[3] may be applied to an input terminal IT[4] of the fourth stage ST[4].

Carry terminals CT[1] to CT[4] of the first to fourth stages ST[1] to ST[4] may output first to fourth carry signals CR[1] to CR[4].

Gate output terminals OT[1] to OT[4] of the first to fourth stages ST[1] to ST[4] may output first to fourth gate output signals OUT[1] to OUT[4].

Figure 3:
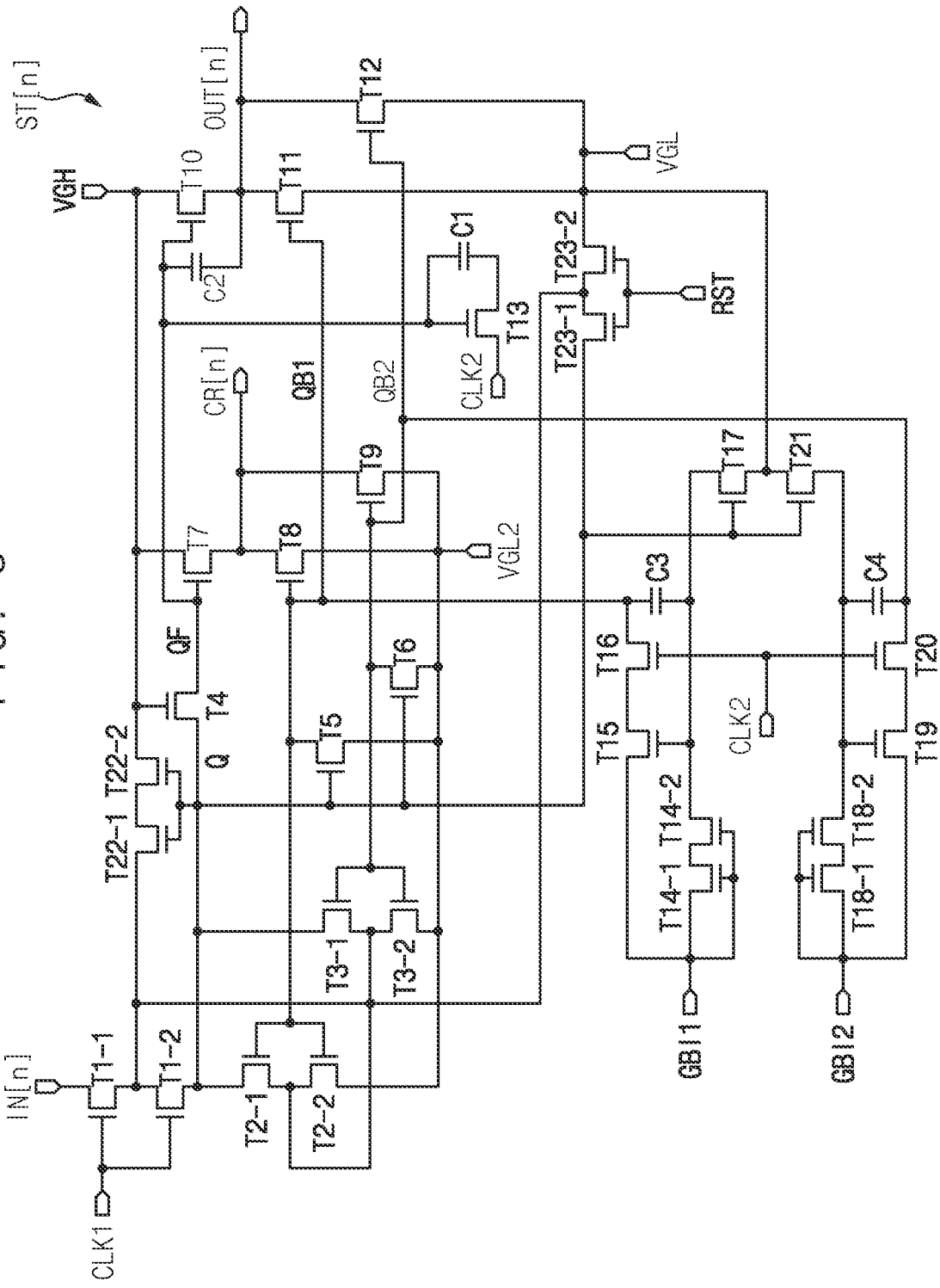
FIG. 3 is a circuit diagram illustrating a stage of the gate driver of FIG. 2.
Figure 4:
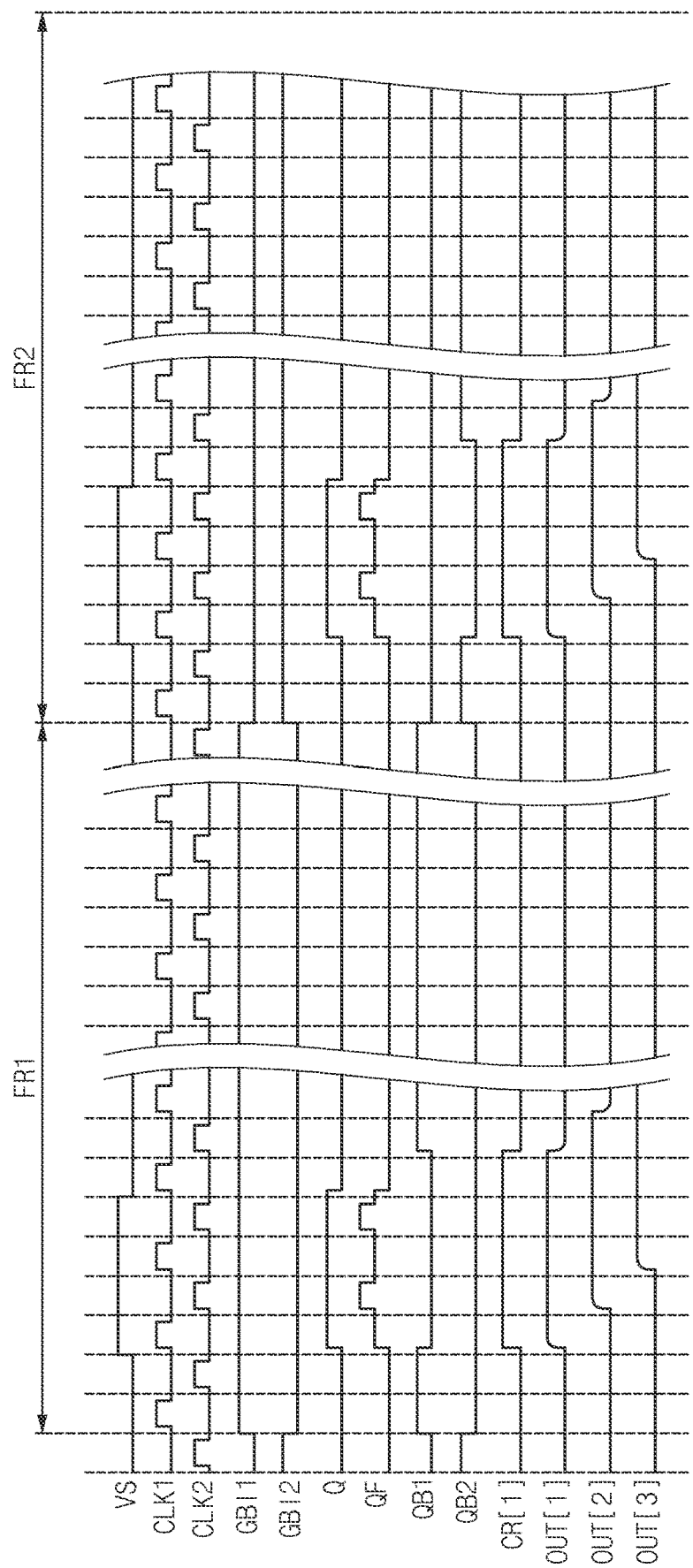
FIG. 4 is a timing diagram illustrating input signals, node signals and output signals of the gate driver of FIG. 2.

FIG. 3 is a circuit diagram illustrating the stage of the gate driver 300 of FIG. 2. FIG. 4 is a timing diagram illustrating input signals, node signals and output signals of the gate driver 300 of FIG. 2.

Referring to FIGS. 1 to 4, the stage ST[n] of the gate driver 300 includes a pull-up circuit for pulling up the gate output signal OUT[n] to the high voltage VGH in response to a signal at a QF node (in other words, "a first node"), a first pull-down circuit for pulling down the gate output signal OUT[n] to the first low voltage VGL in response to a signal at a QB1 node (in other words, "a second node"), a second pull-down circuit for pulling down the gate output signal OUT[n] to the first low voltage VGL in response to a signal at a QB2 node (in other words, "a third node"), a first selection circuit for activating the first pull-down circuit and deactivating the second pull-down circuit based on the first selection signal GBI1 and a second selection circuit for activating the second pull-down circuit and deactivating the first pull-down circuit based on the second selection signal GBI2. Here, "n" is a natural number.

Herein, the first pull-down circuit and the second pull-down circuit may include a transistor which outputs a low signal during most of frames. To prevent a deterioration of a driving capability of the first pull-down circuit and the second pull-down circuit, the first pull-down circuit and the second pull-down circuit may alternately operate. For example, when the first pull-down circuit operates in a specific frame, the second pull-down circuit may not operate in the specific frame. For example, when the second pull-down circuit operates in a specific frame, the first pull-down circuit may not operate in the specific frame.

For example, the pull-up circuit may include a tenth transistor T10 including a control electrode connected to the QF node, an input electrode for receiving the high voltage VGH and an output electrode connected to a gate output terminal and a second capacitor C2 connected to the control electrode of the tenth transistor T10 and the output electrode of the tenth transistor T10. The second capacitor C2 may be a boosting capacitor which quickly pulls up the gate output signal OUT[n].

For example, the first pull-down circuit may include an eleventh transistor T11 and the second pull-down circuit may include a twelfth transistor T12.

The first selection circuit may include a 14-1 transistor including a control electrode for receiving the first selection signal GBI1, an input electrode for receiving the first selection signal GBI1 and an output electrode connected to a fourteenth intermediate node, a 14-2 transistor including a control electrode for receiving the first selection signal GBI1, an input electrode connected to the fourteenth intermediate node and an output electrode connected to a control electrode of a fifteenth transistor T15, the fifteenth transistor T15 including the control electrode connected to the output electrode of the 14-2 transistor, an input electrode for receiving the first selection signal GBI1 and an output electrode connected to an input electrode of a sixteenth transistor T16 and the sixteenth transistor T16 including a control electrode for receiving the second clock signal CLK2, the input electrode connected to the output electrode of the fifteenth transistor T15 and an output electrode connected to the QB1 node.

The first selection circuit may further include a third capacitor C3 including a first electrode connected to the control electrode of the fifteenth transistor T15 and a second electrode connected to the QB1 node.

The third capacitor C3 may speed up turn-on and turn-off of the fifteenth transistor T15 to enable a high-speed driving of the display apparatus.

The second selection circuit may include a 18-1 transistor including a control electrode for receiving the second selection signal GBI2, an input electrode for receiving the second selection signal GBI2 and an output electrode connected to an eighteenth intermediate node, a 18-2 transistor including a control electrode for receiving the second selection signal GBI2, an input electrode connected to the eighteenth intermediate node and an output electrode connected to a control electrode of a nineteenth transistor T19, the nineteenth transistor T19 including the control electrode connected to the output electrode of the 18-2 transistor, an input electrode for receiving the second selection signal GBI2 and an output electrode connected to an input electrode of a twentieth transistor T20 and the twentieth transistor T20 including a control electrode for receiving the second clock signal CLK2, the input electrode connected to the output electrode of the nineteenth transistor T19 and an output electrode connected to the QB2 node.

The second selection circuit may further include a fourth capacitor C4 including a first electrode connected to the control electrode of the nineteenth transistor T19 and a second electrode connected to the QB2 node.

The fourth capacitor C4 may speed up turn-on and turn-off of the nineteenth transistor T19 to enable a high-speed driving of the display apparatus.

The stage of the gate driver 300 may further include a seventeenth transistor T17 for applying the first low voltage VGL to the control electrode of the fifteenth transistor T15 in response to a signal at a Q node.

When the signal at the Q node has a high level, the seventeenth transistor T17 is turned on so that the first low voltage VGL is applied to the control electrode of the fifteenth transistor T15 and accordingly, the fifteenth transistor T15 is turned off. While the signal at the Q node has a high level, there is a period in which the first selection signal GBI1 also has a high level. In a period in which both the signal at the Q node and the first selection signal GBI1 have a high level, not only the seventeenth transistor T17, but also the 14-1 transistor T14-1 and the 14-2 transistor T14-2 may be turned on. When the seventeenth transistor T17, the 14-1 transistor T14-1 and the 14-2 transistor T14-2 are turned on, the signal at the control electrode of the fifteenth transistor T15 may maintain a level of the first low voltage VGL by a voltage drop due to resistance components of the 14-1 transistor T14-1 and the 14-2 transistor T14-2. Thus, even when both the signal at the Q node and the first selection signal GBI1 have a high level, a turned-off state of the fifteenth transistor T15 may be well maintained. In this case, the 14-1 transistor T14-1 and the 14-2 transistor T14-2 may function as a kind of an inverter having a diode connection.

In addition, even when the sixteenth transistor T16 is repeatedly turned on and off by the second clock signal CLK2 applied to the sixteenth transistor T16, the QB1 node may stably maintain a low level due to the third capacitor C3 and a parasitic capacitance of the eleventh transistor T11. Thus, even when the sixteenth transistor T16 is repeatedly turned on and off, a high level of the gate output signal OUT[n] and a high level of the carry signal CR[n] may be stably outputted.

The stage of the gate driver 300 may further include a twenty first transistor T21 for applying the first low voltage VGL to the control electrode of the nineteenth transistor T19 in response to a signal at the Q node.

When the signal at the Q node has a high level, the twenty first transistor T21 is turned on so that the first low voltage VGL is applied to the control electrode of the nineteenth transistor T19 and accordingly, the nineteenth transistor T19 is turned off. While the signal at the Q node has a high level, there is a period in which the second selection signal GBI2 also has a high level. In a period in which both the signal at the Q node and the second selection signal GBI2 have a high level, not only the twenty first transistor T21, but also the 18-1 transistor T18-1 and the 18-2 transistor T18-2 may be turned on. When the twenty first transistor T21, the 18-1 transistor T18-1 and the 18-2 transistor T18-2 are turned on, the signal at the control electrode of the nineteenth transistor T19 may maintain a level of the first low voltage VGL by a voltage drop due to resistance components of the 18-1 transistor T18-1 and the 18-2 transistor T18-2. Thus, even when both the signal at the Q node and the second selection signal GBI2 have a high level, a turned-off state of the nineteenth transistor T19 may be well maintained. In this case, the 18-1 transistor T18-1 and the 18-2 transistor T18-2 may function as a kind of an inverter having a diode connection.

In addition, even when the twentieth transistor T20 is repeatedly turned on and off by the second clock signal CLK2 applied to the twentieth transistor T20, the QB2 node may stably maintain a low level due to the fourth capacitor C4 and a parasitic capacitance of the twelfth transistor T12. Thus, even when the twentieth transistor T20 is repeatedly turned on and off, a high level of the gate output signal OUT[n] and a high level of the carry signal CR[n] may be stably outputted.

The stage of the gate driver 300 may further include a carry pull-up circuit for pulling up the carry signal CR[n] to the high voltage VGH in response to the signal at the QF node, a first carry pull-down circuit for pulling down the carry signal CR[n] to the second low voltage VGL2 in response to the signal at the QB1 node and a second carry pull-down circuit for pulling down the carry signal CR[n] to the second low voltage VGL2 in response to the signal at the QB2 node.

The carry pull-up circuit may include a seventh transistor T7 including a control electrode connected to the QF node, an input electrode for receiving the high voltage VGH and an output electrode connected to a carry output terminal for outputting the carry signal CR[n].

The first carry pull-down circuit may include an eighth transistor T8 including a control electrode connected to the QB1 node, an input electrode for receiving the second low voltage VGL2 and an output electrode connected to the carry output terminal.

The second carry pull-down circuit may include a ninth transistor T9 including a control electrode connected to the QB2 node, an input electrode for receiving the second low voltage VGL2 and an output electrode connected to the carry output terminal.

The stage of the gate driver 300 may further include a boosting circuit for boosting the signal at the QF node using the second clock signal CLK2 in response to the signal at the QF node.

The boosting circuit may include a thirteenth transistor T13 including a control electrode connected to the QF node, an input electrode for receiving the second clock signal CLK2 and an output electrode connected to a second electrode of a first capacitor C1 and the first capacitor C1 including a first electrode connected to the QF node and the second electrode.

The stage of the gate driver 300 may further include an input circuit for transmitting an input signal IN[n] to the Q node (in other words, "a fourth node") in response to the first clock signal CLK1.

The input circuit may include an 1-1 transistor T1-1 including a control electrode for receiving the first clock signal CLK1, an input electrode for receiving the input signal IN[n] and an output electrode connected to a first intermediate node and an 1-2 transistor T1-2 including a control electrode for receiving the first clock signal CLK1, an input electrode connected to the first intermediate node and an output electrode connected to the Q node.

The stage of the gate driver 300 may further include a fourth transistor including a control electrode for receiving the high voltage VGH, an input electrode connected to the Q node and an output electrode connected to the QF node.

The stage of the gate driver 300 may further include a first Q node control circuit for applying the second low voltage VGL2 to the Q node in response to the signal at the QB1 node.

The first Q node control circuit may include a 2-1 transistor T2-1 including a control electrode connected to the QB1 node, an input electrode connected to a second intermediate node and an output electrode connected to the Q node and a 2-2 transistor T2-2 including a control electrode connected to the QB1 node, an input electrode for receiving the second low voltage VGL2 and an output electrode connected to the second intermediate node.

The stage of the gate driver 300 may further include a second Q node control circuit for applying the second low voltage VGL2 to the Q node in response to the signal at the QB2 node.

The second Q node control circuit may include a 3-1 transistor T3-1 including a control electrode connected to the QB2 node, an input electrode connected to a third intermediate node and an output electrode connected to the Q node and a 3-2 transistor T3-2 including a control electrode connected to the QB2 node, an input electrode for receiving the second low voltage VGL2 and an output electrode connected to the third intermediate node.

The stage of the gate driver 300 may further include a fifth transistor T5 for applying the second low voltage VGL2 to the QB1 node in response to the signal at the Q node.

The stage of the gate driver 300 may further include a sixth transistor T6 for applying the second low voltage VGL2 to the QB2 node in response to the signal at the Q node.

The stage of the gate driver 300 may further include a reset circuit for applying the first low voltage VGL to the Q node in response to the reset signal RST.

The reset circuit may include a 23-2 transistor T23-2 including a control electrode for receiving the reset signal RST, an input electrode for receiving the first low voltage VGL and an output electrode connected to a twenty third intermediate node and a 23-1 transistor T23-1 including a control electrode for receiving the reset signal RST, an input electrode connected to the twenty third intermediate node and an output electrode connected to the Q node.

The reset signal RST may have an active level in a period when the display apparatus is turned on.

The stage of the gate driver 300 may further include a stabilizing circuit for applying the high voltage VGH to the first intermediate node, the second intermediate node and the third intermediate node in response to the signal at the Q node.

The stabilizing circuit may include a 22-1 transistor T22-1 including a control electrode connected to the Q node, an input electrode connected to a twenty second intermediate node and an output electrode connected to the first intermediate node, the second intermediate node and the third intermediate node and a 22-2 transistor T22-2 including a control electrode connected to the Q node, an input electrode for receiving the high voltage VGH and an output electrode connected to the twenty second intermediate node.

Referring to FIG. 4, the first selection signal GBI1 has a high level and the second selection signal GBI2 has a low level in a first frame FR1 so that the first pull-down circuit and the first carry pull-down circuit may operate. In contrast, the second pull-down circuit and the second carry pull-down circuit may not operate in the first frame FR1.

The second selection signal GBI2 has a high level and the first selection signal GBI1 has a low level in a second frame FR2 so that the second pull-down circuit and the second carry pull-down circuit may operate. In contrast, the first pull-down circuit and the first carry pull-down circuit may not operate in the second frame FR2.

As explained above, the first pull-down circuit and the second pull-down circuit may alternately operate. For example, the first pull-down circuit and the second pull-down circuit may alternately operate in a unit of a frame. Alternatively, the first pull-down circuit and the second pull-down circuit may alternately operate in a unit of several frames.

Similarly, the first carry pull-down circuit and the second carry pull-down circuit may alternately operate. For example, the first carry pull-down circuit and the second carry pull-down circuit may alternately operate in a unit of a frame. Alternatively, the first carry pull-down circuit and the second carry pull-down circuit may alternately operate in a unit of several frames.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 5:
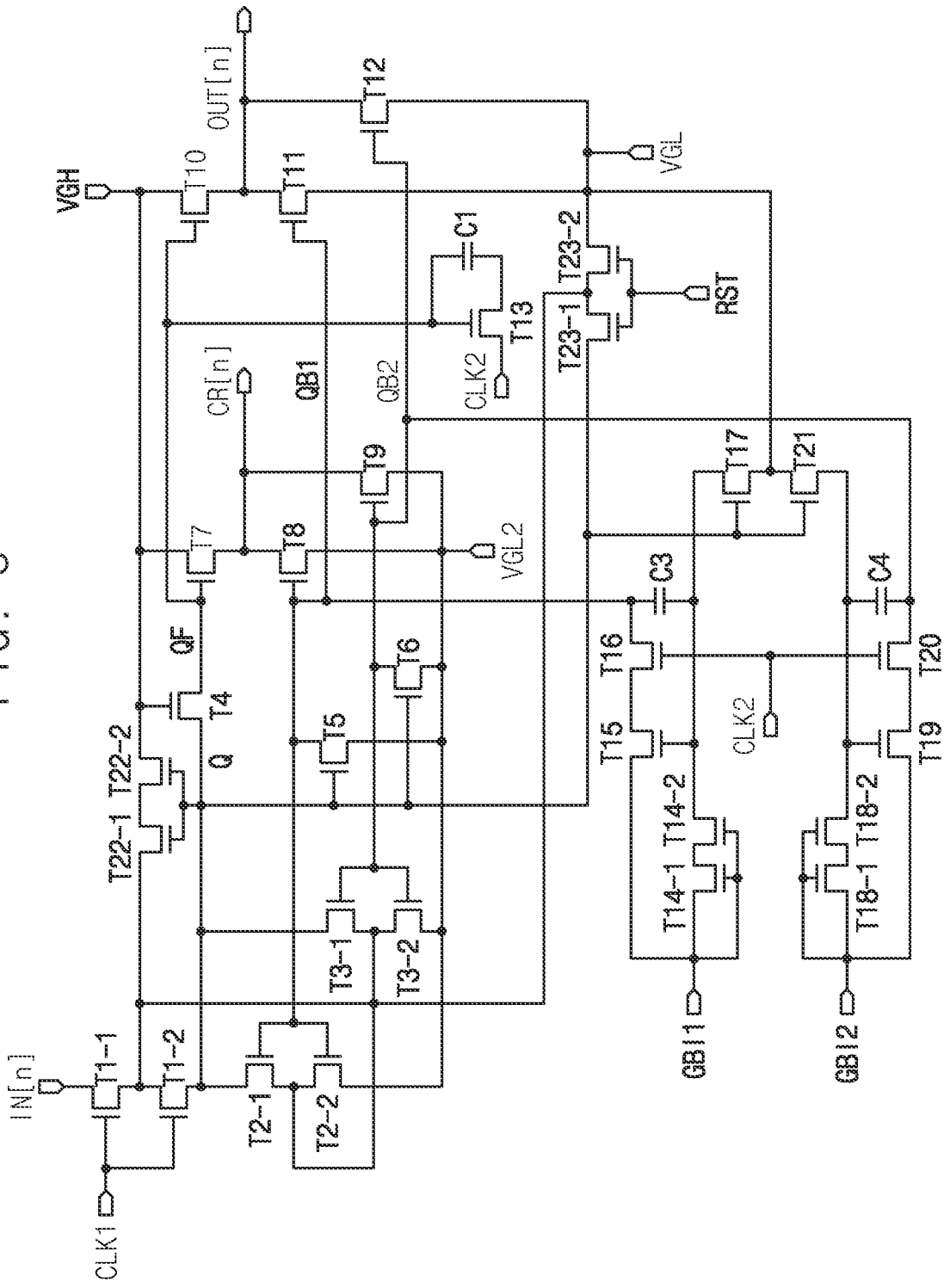
FIG. 5 is a circuit diagram illustrating a stage of a gate driver according to an embodiment of the present invention.
Figure 6:
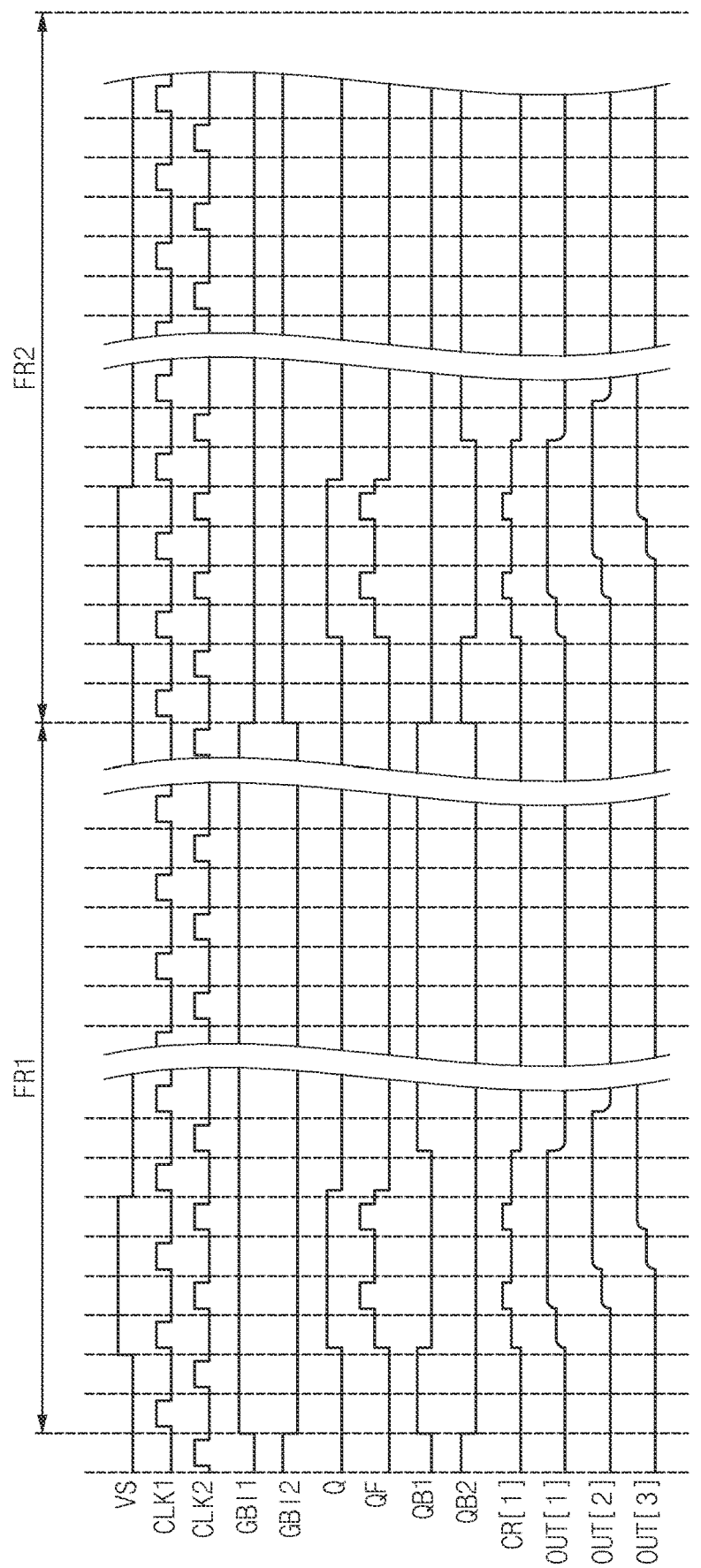
FIG. 6 is a timing diagram illustrating input signals, node signals and output signals of the gate driver of FIG. 5.

FIG. 5 is a circuit diagram illustrating a stage of a gate driver 300 according to an embodiment of the present invention. FIG. 6 is a timing diagram illustrating input signals, node signals and output signals of the gate driver 300 of FIG. 5.

The stage of the gate driver 300 according to the present embodiment is substantially the same as the stage of the gate driver 300 of the previous embodiment illustrated in FIG. 3 except that the stage does not include the second capacitor C2. Thus, the same reference numerals will be used to refer to the same or like parts as those described in the previous embodiment of FIGS. 1 to 3 and any repetitive explanation concerning the above elements will be omitted.

The input signals, the node signals and the output signals of the gate driver 300 according to the present embodiment is substantially the same as the input signals, the node signals and the output signals of the gate driver 300 of the previous embodiment illustrated in FIG. 4 except that the carry signal CR and the gate output signal OUT increase in two steps since the stage does not include the second capacitor C2. Thus, the same reference numerals will be used to refer to the same or like parts as those described in the previous embodiment of FIGS. 1 to 3 and any repetitive explanation concerning the above elements will be omitted.

The second capacitor C2 may be the boosting capacitor which quickly pulls up the gate output signal OUT[n]. The second capacitor C2 may not be needed depending on characteristics of the display panel 100, the gate driver 300 and the display apparatus. When the stage of the gate driver 300 does not include the second capacitor C2, an area of the stage of the gate driver 300 may be reduced so that a dead space of the display apparatus may be reduced.

A voltage level of the signal at the QF node may be slightly less than a voltage level of the signal at the Q node due to a threshold voltage of the fourth transistor T4. In the present embodiment, the stage does not include the second capacitor C2 so that the seventh transistor T7 and the tenth transistor T10 may not completely turned on when the signal at the Q node has a high level and the signal at the QF node has a first high level. Accordingly, the carry signal CR and the gate output signal may increase to a first step when the signal at the Q node has the high level and the signal at the QF node has the first high level.

Then, when the signal at the QF node is boosted to a second high level in synchronization with a high level of the second clock signal CLK2 by the thirteenth transistor T13 and the first capacitor C1, the seventh transistor T7 and the tenth transistor T10 may be completely turned on. When the seventh transistor T7 and the tenth transistor T10 are completely turned on, the carry signal CR and the gate output signal OUT may increase to a second step.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 7:
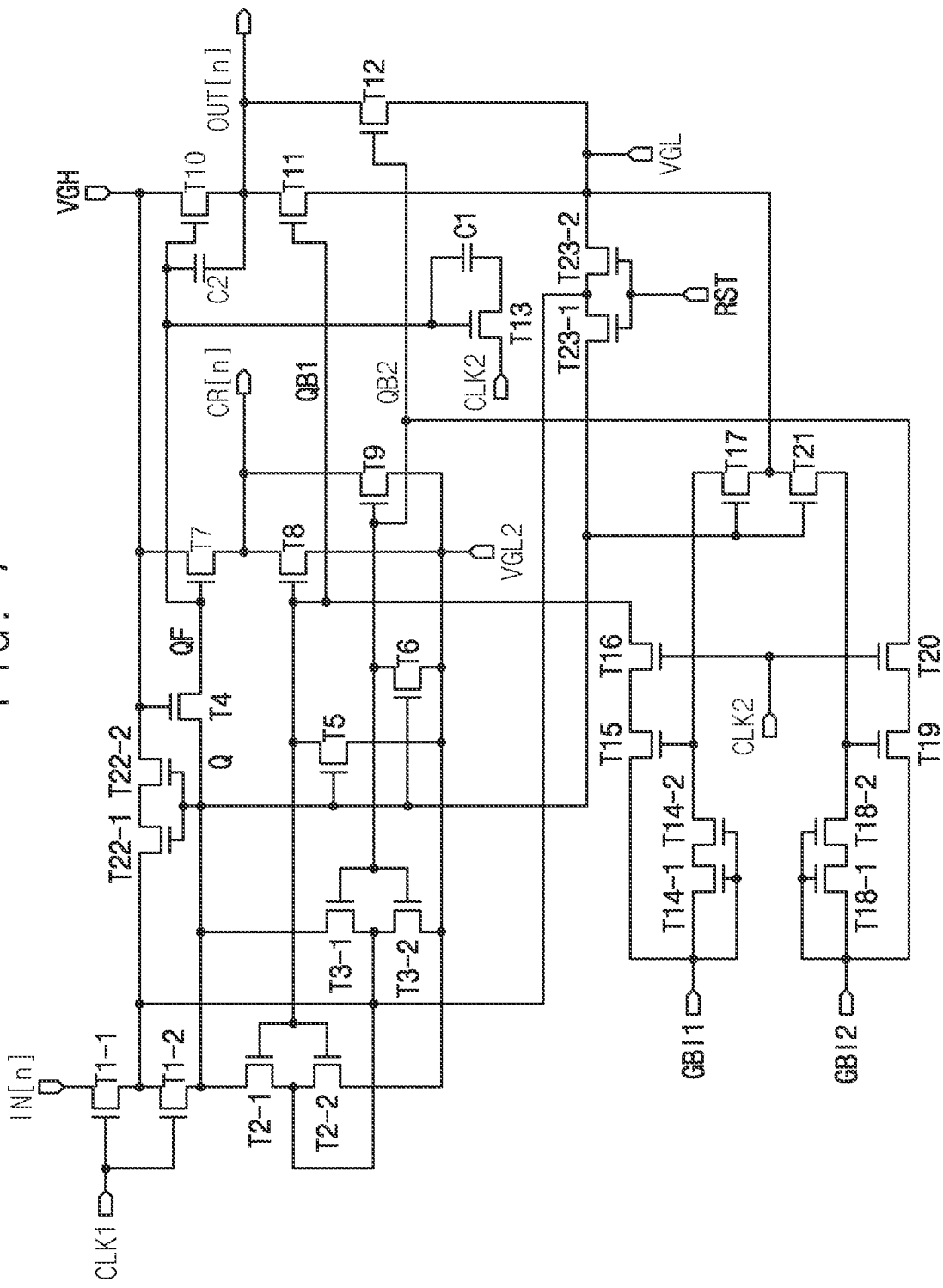
FIG. 7 is a circuit diagram illustrating a stage of a gate driver according to an embodiment of the present invention.

FIG. 7 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the third capacitor C3 and the fourth capacitor C4. Thus, the same reference numerals will be used to refer to the same or like parts as those described in the previous embodiment of FIGS. 1 to 3 and any repetitive explanation concerning the above elements will be omitted.

The third capacitor C3 may speed up turn-on and turn-off of the fifteenth transistor T15 to enable a high-speed driving of the display apparatus. The fourth capacitor C4 may speed up turn-on and turn-off of the nineteenth transistor T19 to enable a high-speed driving of the display apparatus. The third capacitor C3 and the fourth capacitor C4 may not be needed depending on characteristics of the display panel 100, the gate driver 300 and the display apparatus. When the stage of the gate driver 300 does not include the third capacitor C3 and the fourth capacitor C4, an area of the stage of the gate driver 300 may be reduced so that a dead space of the display apparatus may be reduced.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 8:
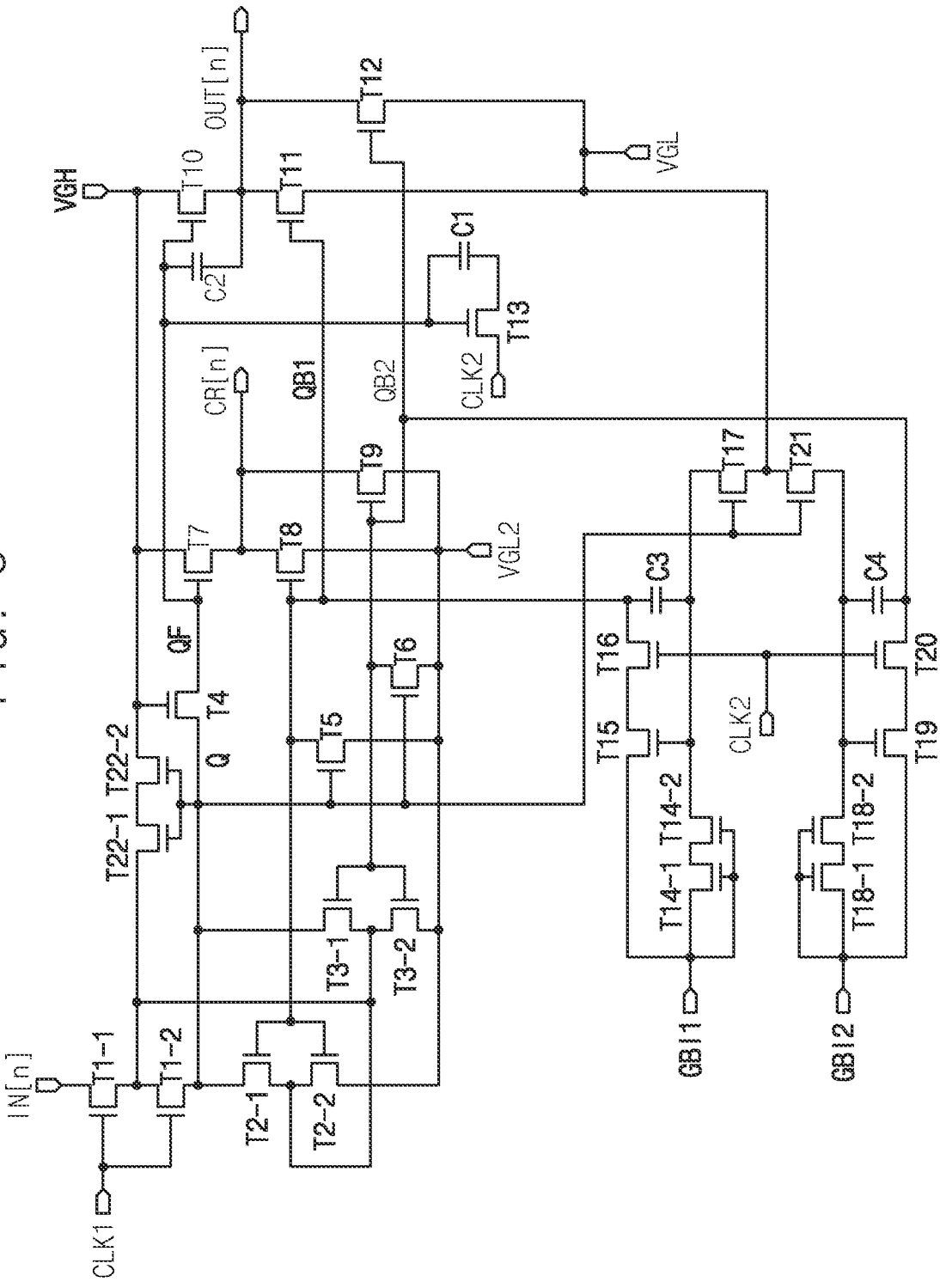
FIG. 8 is a circuit diagram illustrating a stage of a gate driver according to an embodiment of the present invention.

FIG. 8 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the reset circuit T23-1 and T23-2. Thus, the same reference numerals will be used to refer to the same or like parts as those described in the previous embodiment of FIGS. 1 to 3 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 9:
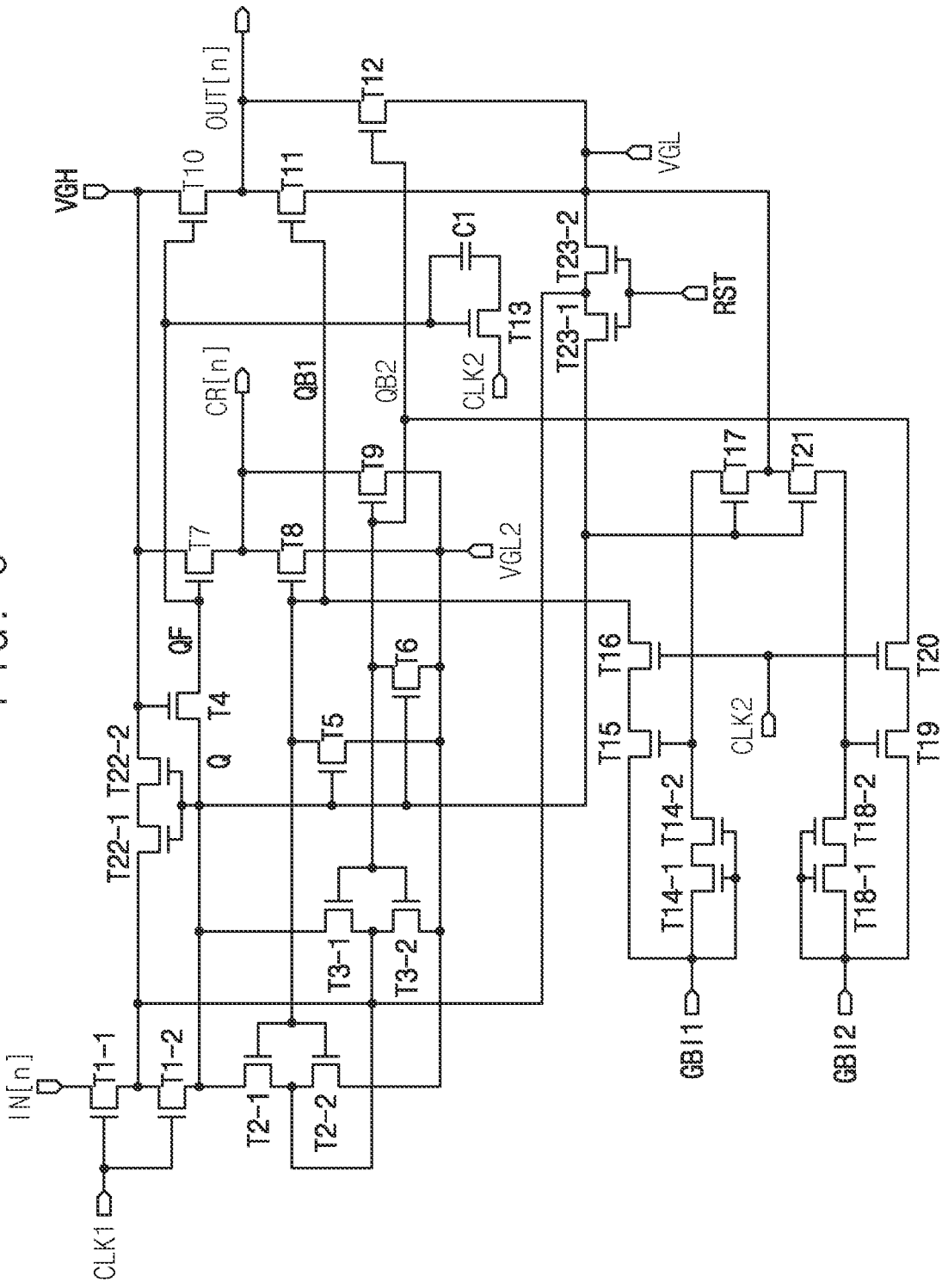
FIG. 9 is a circuit diagram illustrating a stage of a gate driver according to an embodiment of the present invention.

FIG. 9 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the second capacitor C2, the third capacitor C3 and the fourth capacitor C4. Thus, the same reference numerals will be used to refer to the same or like parts as those described in the previous embodiment of FIGS. 1 to 3 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 10:
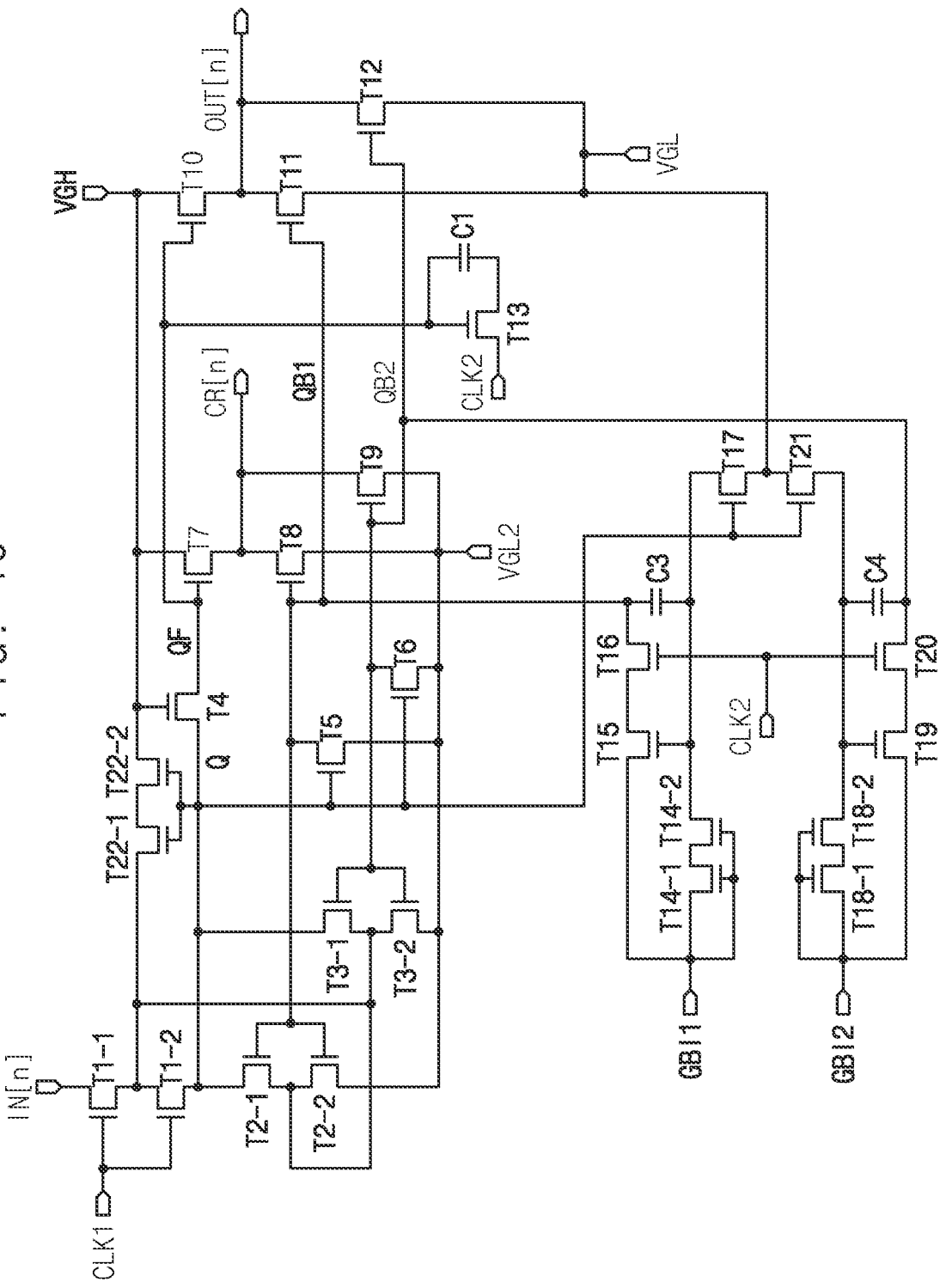
FIG. 10 is a circuit diagram illustrating a stage of a gate driver according to an embodiment of the present invention.

FIG. 10 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the second capacitor C2 and the reset circuit T23-1 and T23-2. Thus, the same reference numerals will be used to refer to the same or like parts as those described in the previous embodiment of FIGS. 1 to 3 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 11:
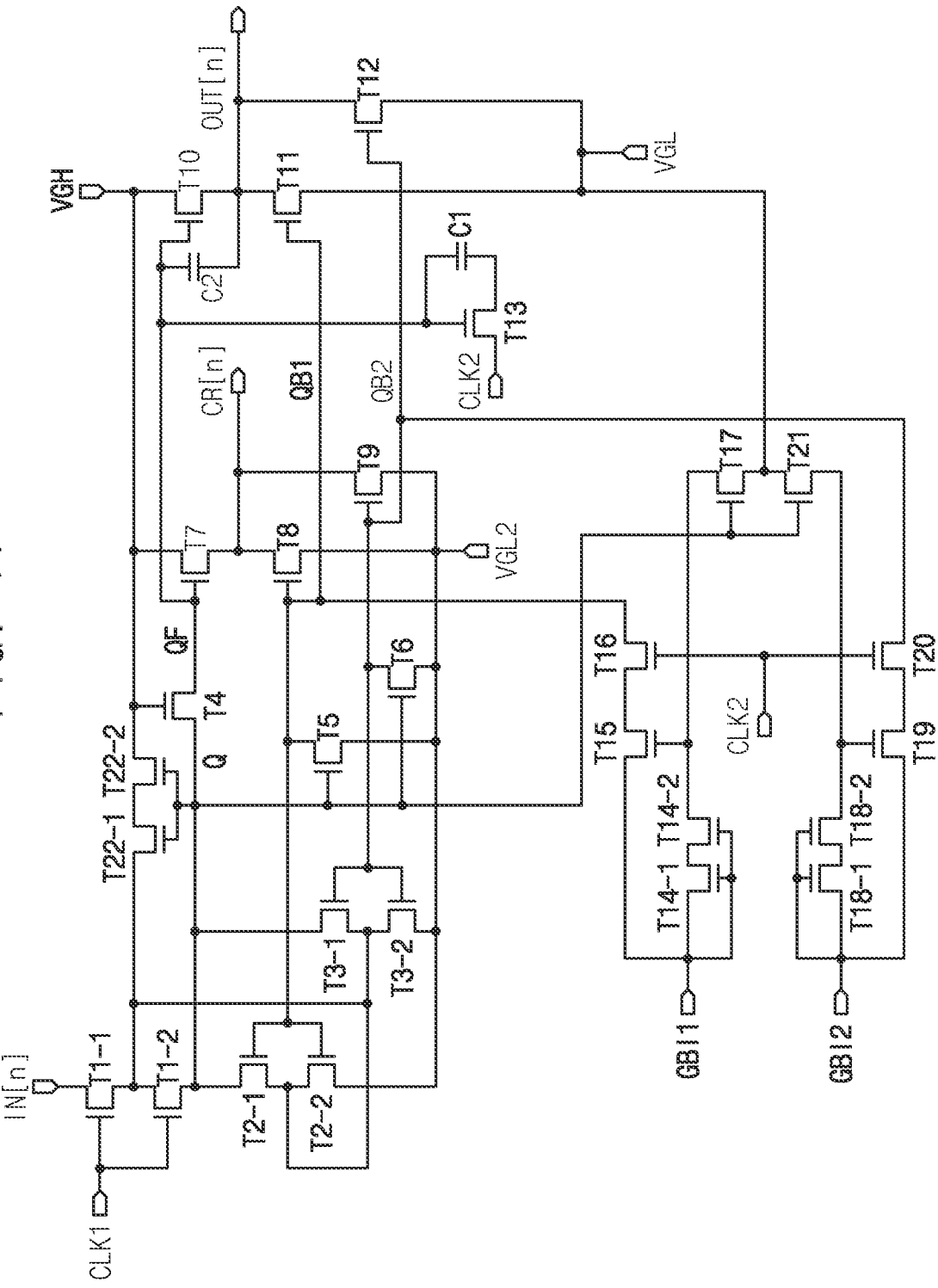
FIG. 11 is a circuit diagram illustrating a stage of a gate driver according to an embodiment of the present invention.

FIG. 11 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the third capacitor C3, the fourth capacitor C4 and the reset circuit T23-1 and T23-2. Thus, the same reference numerals will be used to refer to the same or like parts as those described in the previous embodiment of FIGS. 1 to 3 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 12:
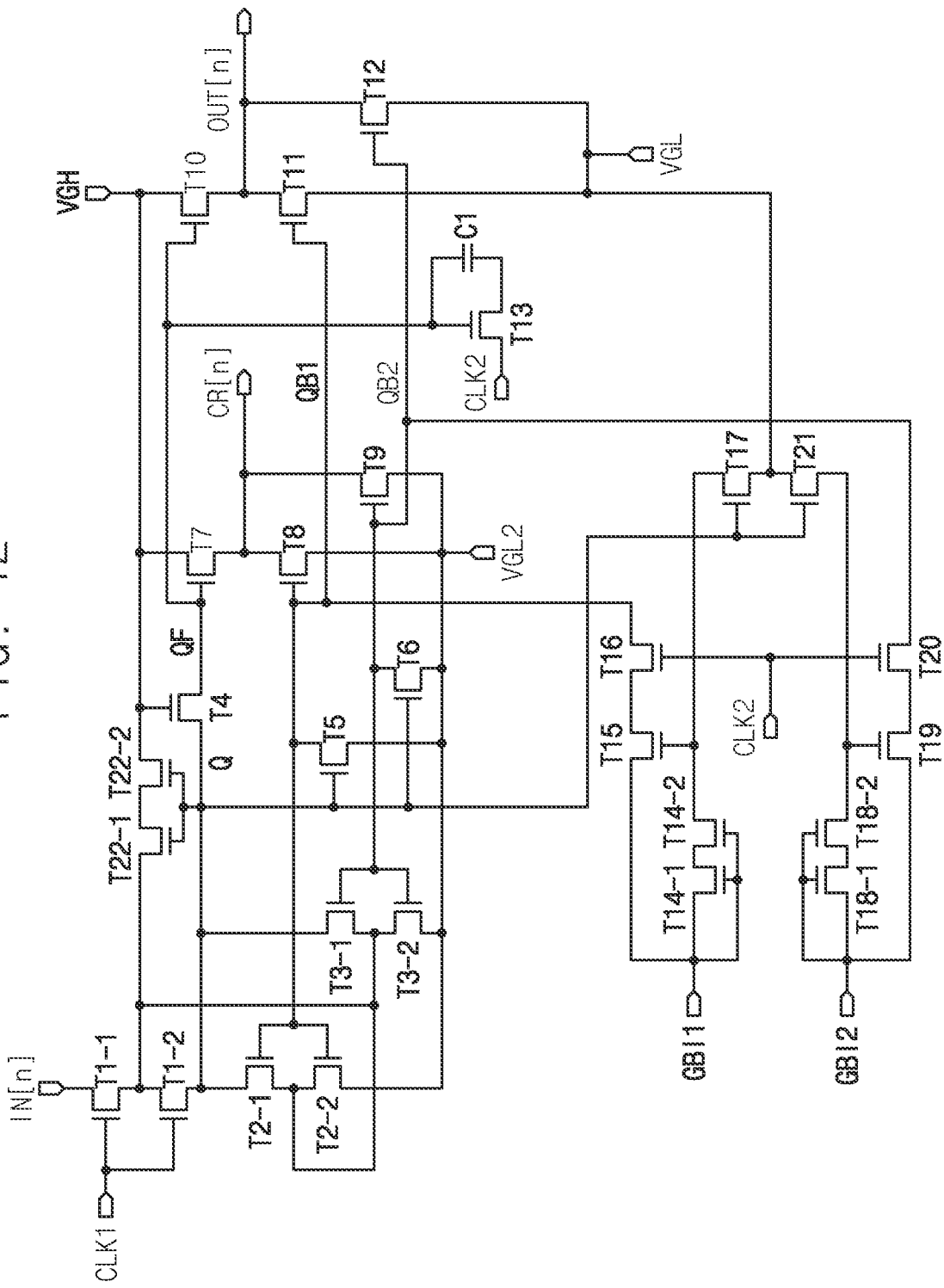
FIG. 12 is a circuit diagram illustrating a stage of a gate driver according to an embodiment of the present invention.

FIG. 12 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage does not include the second capacitor C2, the third capacitor C3, the fourth capacitor C4 and the reset circuit T23-1 and T23-2. Thus, the same reference numerals will be used to refer to the same or like parts as those described in the previous embodiment of FIGS. 1 to 3 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 13:
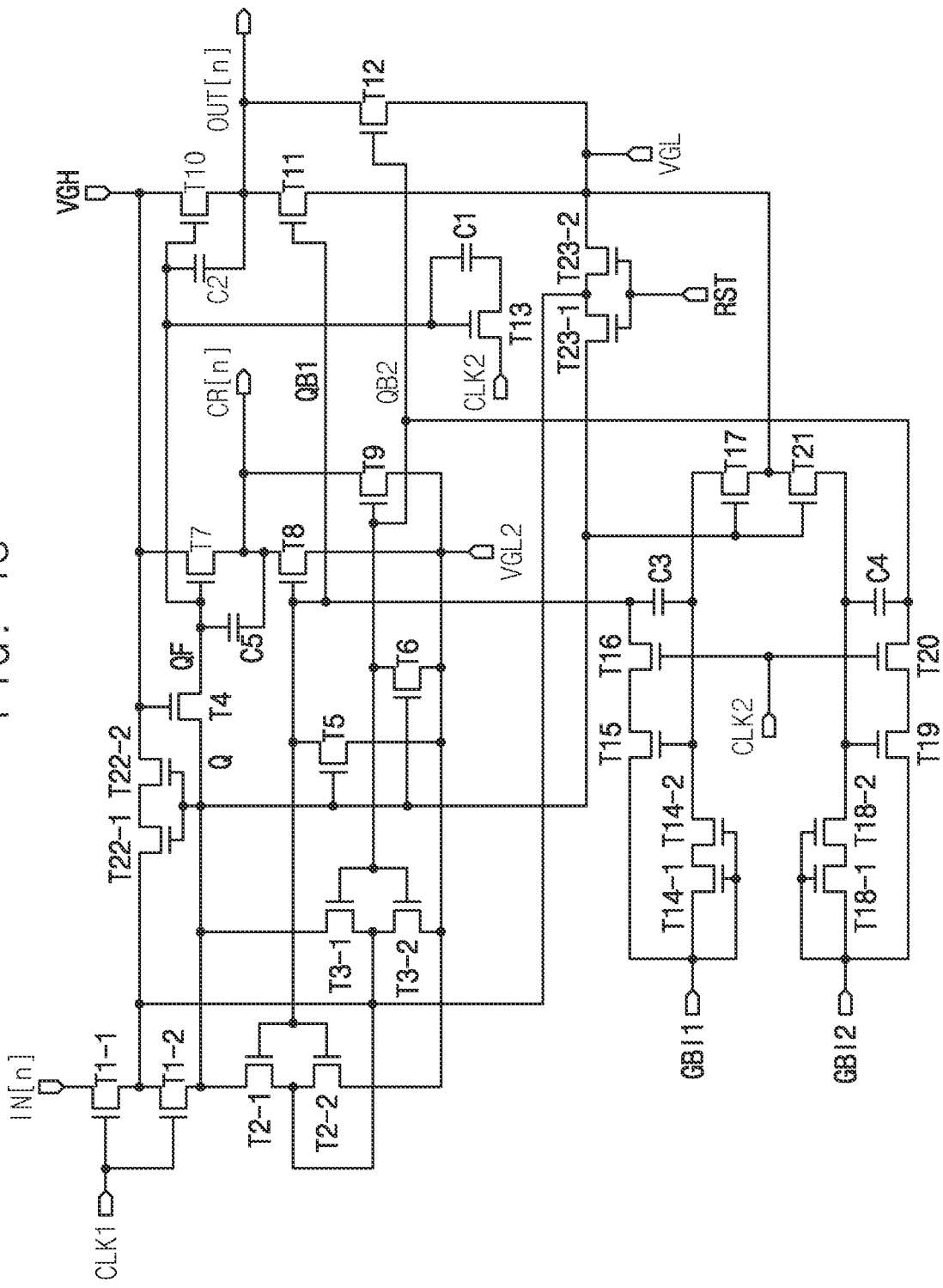
FIG. 13 is a circuit diagram illustrating a stage of a gate driver according to an embodiment of the present invention.

FIG. 13 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage further includes a fifth capacitor C5 connected to the control electrode of the seventh transistor T7 and the output electrode of the seventh transistor T7. Thus, the same reference numerals will be used to refer to the same or like parts as those described in the previous embodiment of FIGS. 1 to 3 and any repetitive explanation concerning the above elements will be omitted.

The carry signal CR[n] may be quickly pulled up by the fifth capacitor C5.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 14:
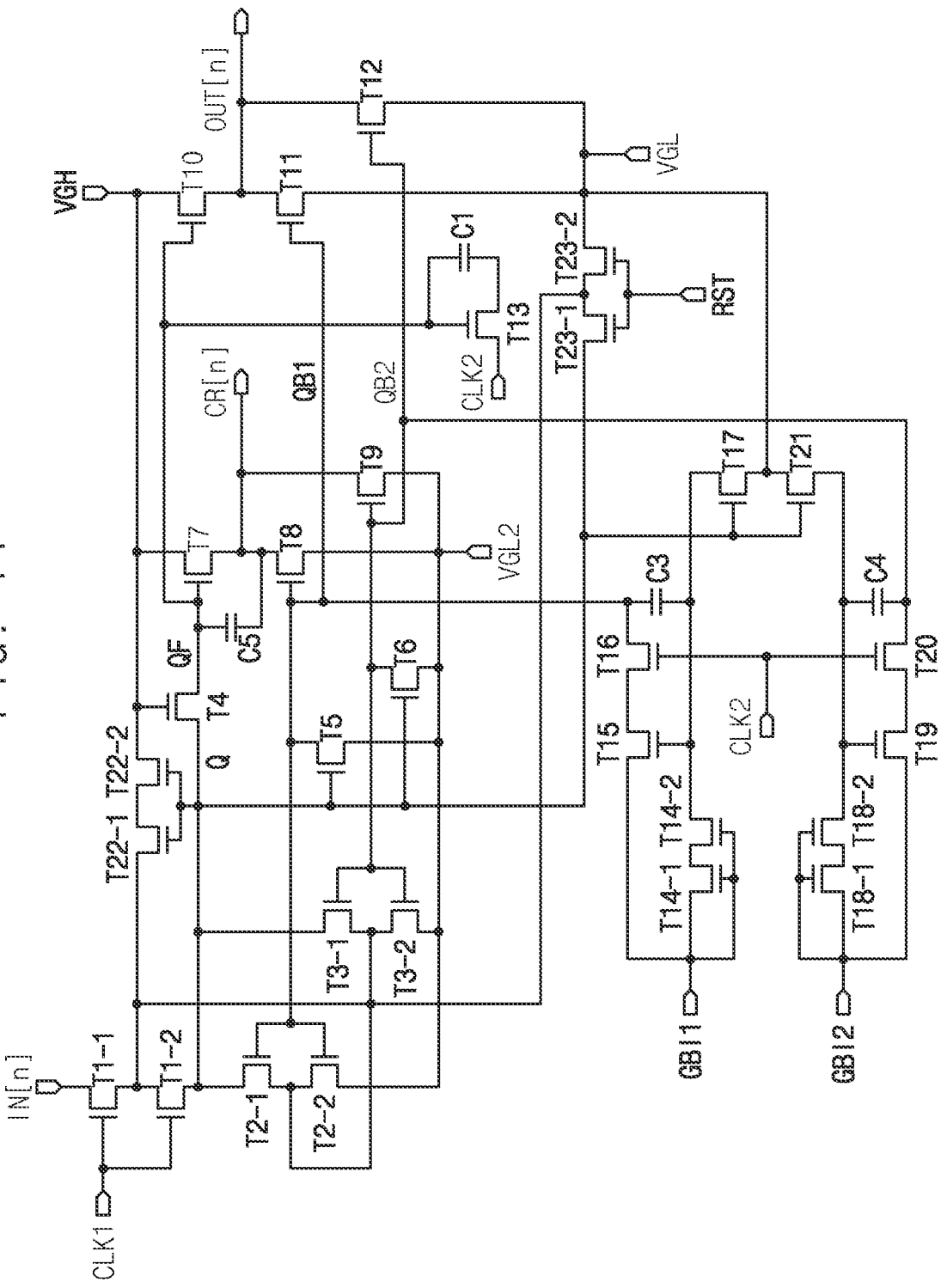
FIG. 14 is a circuit diagram illustrating a stage of a gate driver according to an embodiment of the present invention.

FIG. 14 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 13 except that the stage does not include the second capacitor C2. Thus, the same reference numerals will be used to refer to the same or like parts as those described in the previous embodiment of FIG. 13 and any repetitive explanation concerning the above elements will be omitted.

The carry signal CR[n] may be quickly pulled up by the fifth capacitor C5.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 15:
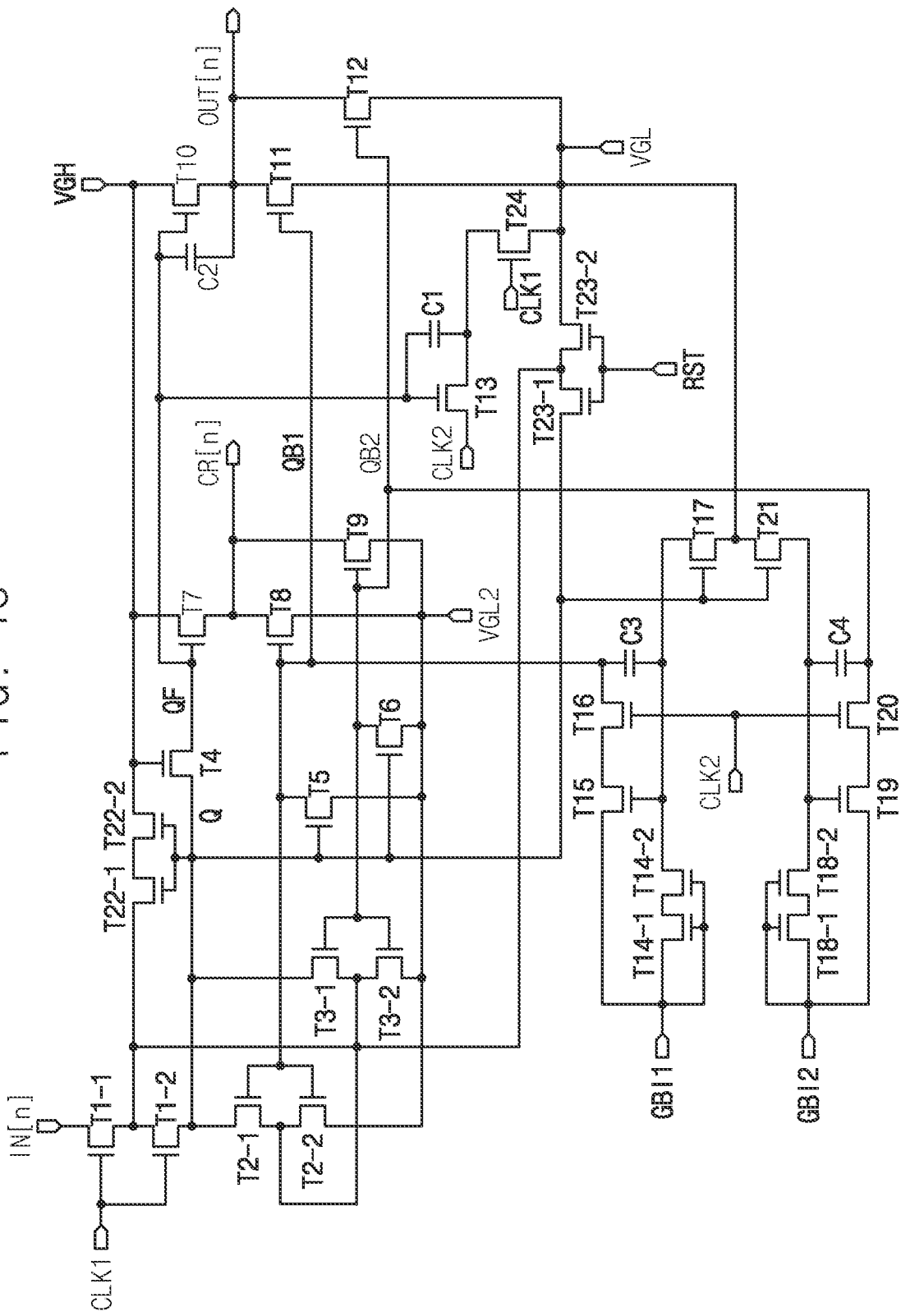
FIG. 15 is a circuit diagram illustrating a stage of a gate driver according to an embodiment of the present invention.

FIG. 15 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except that the stage further includes a twenty fourth transistor T24 connected to a second electrode of the first capacitor C1. Thus, the same reference numerals will be used to refer to the same or like parts as those described in the previous embodiment of FIGS. 1 to 3 and any repetitive explanation concerning the above elements will be omitted.

The twenty fourth transistor T24 may apply the first low voltage VGL to the output electrode of the thirteenth transistor T13 in response to the first clock signal CLK1. The twenty fourth transistor T24 may initialize the second electrode of the first capacitor C1 in response to the first clock signal CLK1.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 16:
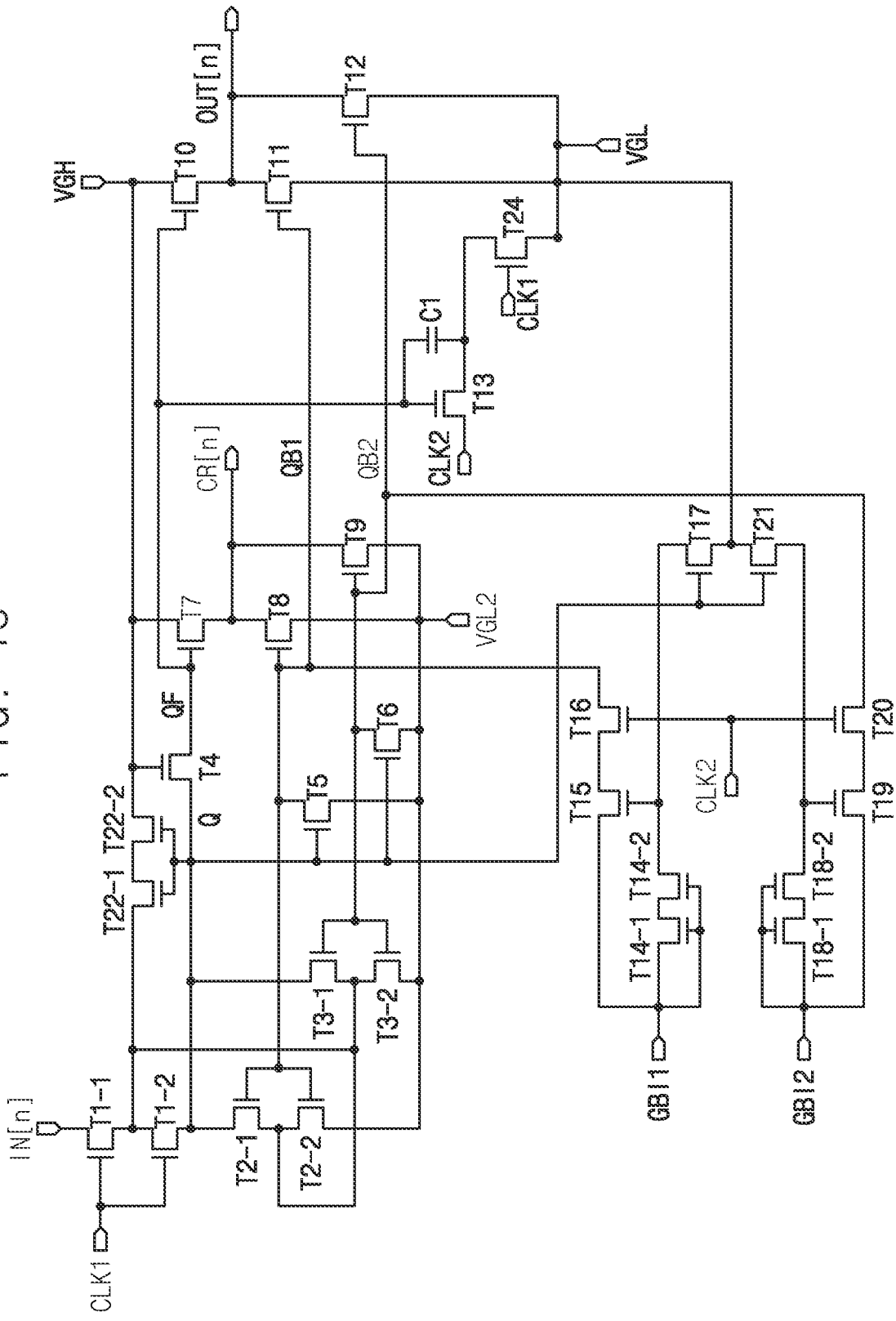
FIG. 16 is a circuit diagram illustrating a stage of a gate driver according to an embodiment of the present invention.

FIG. 16 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 12 except that the stage further includes a twenty fourth transistor T24 connected to a second electrode of the first capacitor C1. Thus, the same reference numerals will be used to refer to the same or like parts as those described in the previous embodiment of FIG. 12 and any repetitive explanation concerning the above elements will be omitted.

The twenty fourth transistor T24 may apply the first low voltage VGL to the output electrode of the thirteenth transistor T13 in response to the first clock signal CLK1. The twenty fourth transistor T24 may initialize the second electrode of the first capacitor C1 in response to the first clock signal CLK1.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 17:
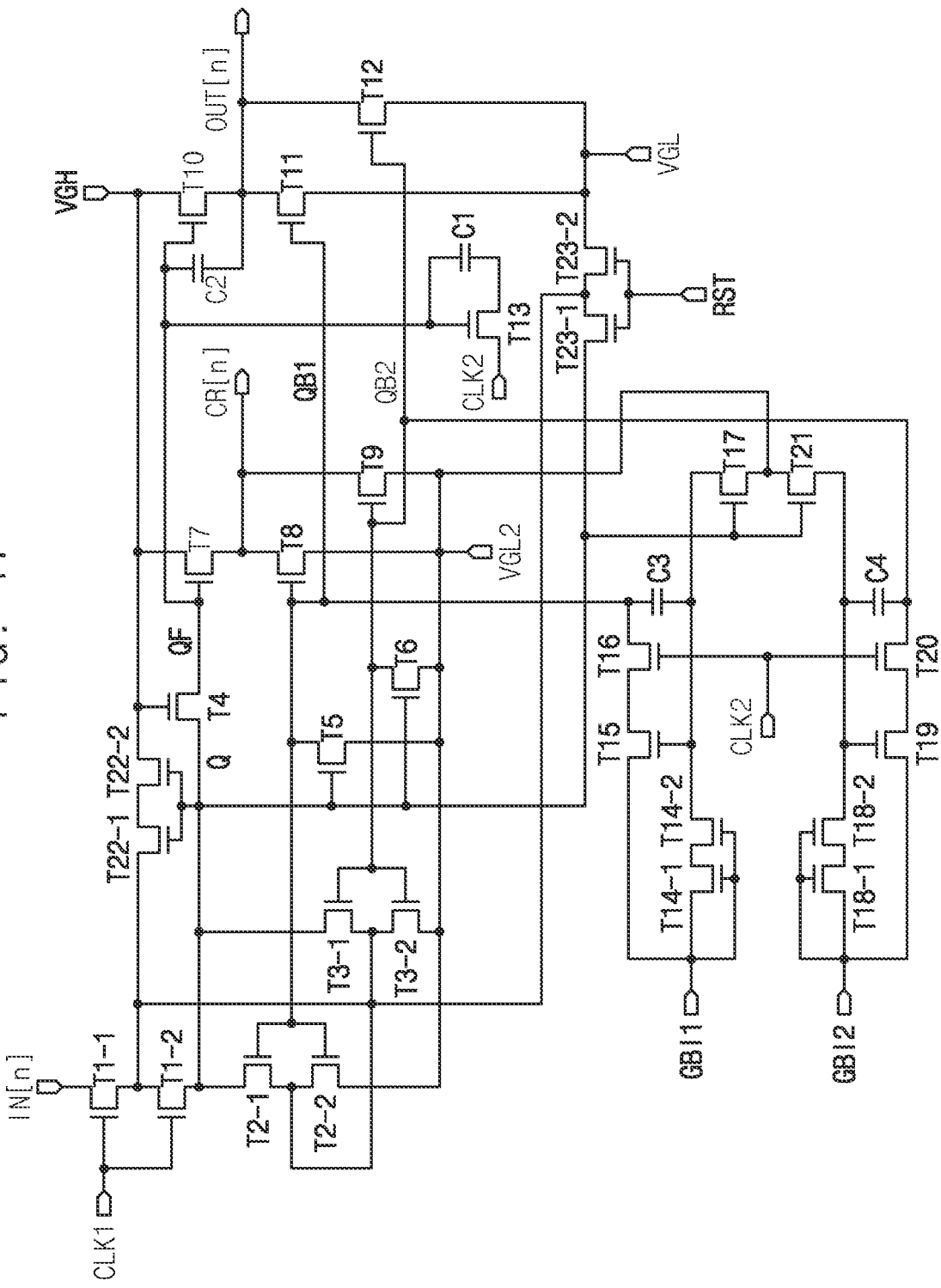
FIG. 17 is a circuit diagram illustrating a stage of a gate driver according to an embodiment of the present invention.

FIG. 17 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 3 except for the voltage applied to the input electrode of the seventeenth transistor T17 and the input electrode of the twenty first transistor T21. Thus, the same reference numerals will be used to refer to the same or like parts as those described in the previous embodiment of FIGS. 1 to 3 and any repetitive explanation concerning the above elements will be omitted.

The stage of the gate driver 300 may include the seventeenth transistor T17 for applying the second low voltage VGL2 to the control electrode of the fifteenth transistor T15 in response to the signal at the Q node.

The stage of the gate driver 300 may further include the twenty first transistor T21 for applying the second low voltage VGL2 to the control electrode of the nineteenth transistor T19 in response to the signal at the Q node.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 18:
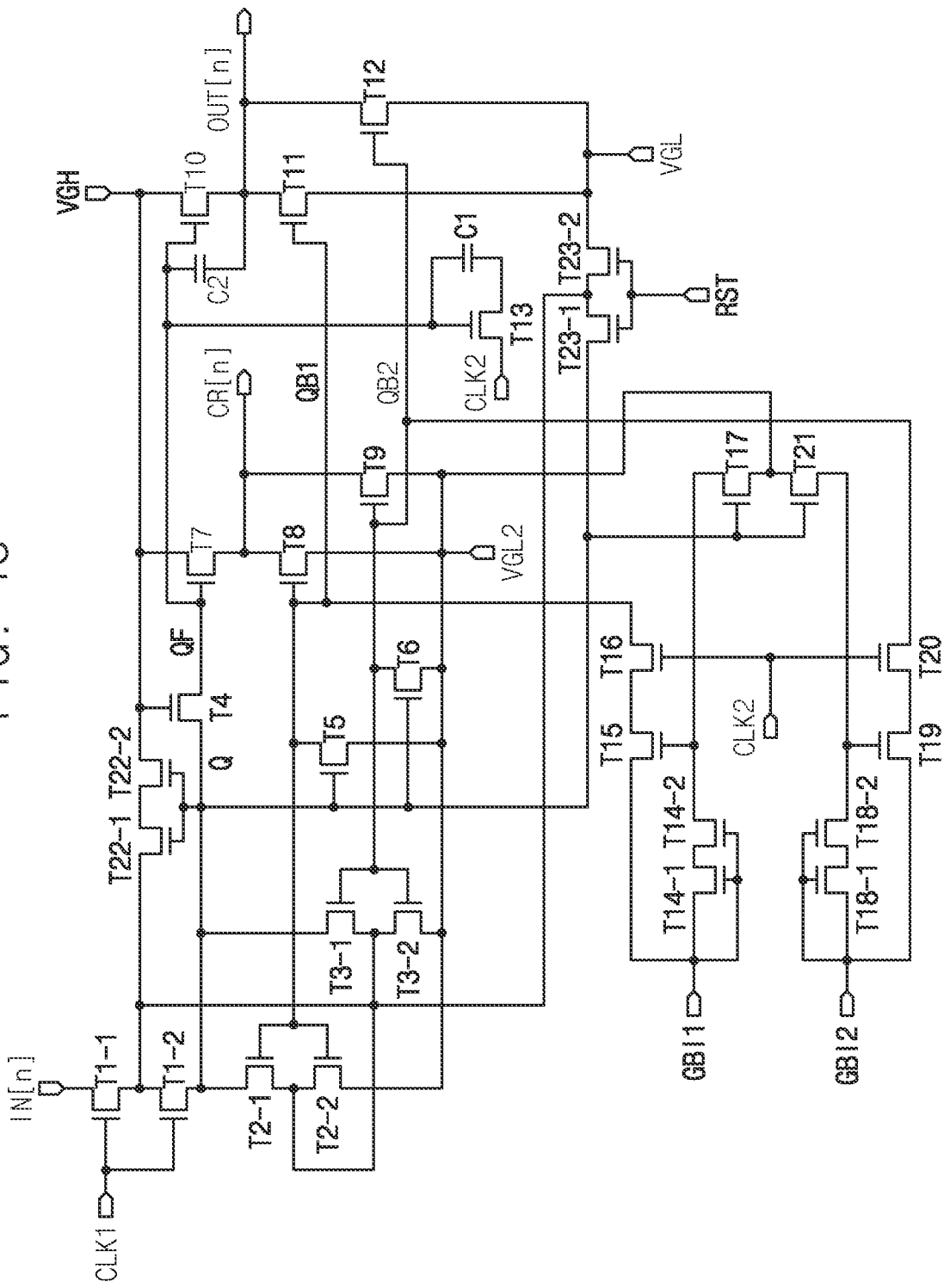
FIG. 18 is a circuit diagram illustrating a stage of a gate driver according to an embodiment of the present invention.

FIG. 18 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 17 except that the stage does not include the third capacitor C3 and the fourth capacitor C4. Thus, the same reference numerals will be used to refer to the same or like parts as those described in the previous embodiment of FIG. 17 and any repetitive explanation concerning the above elements will be omitted.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

Figure 19:
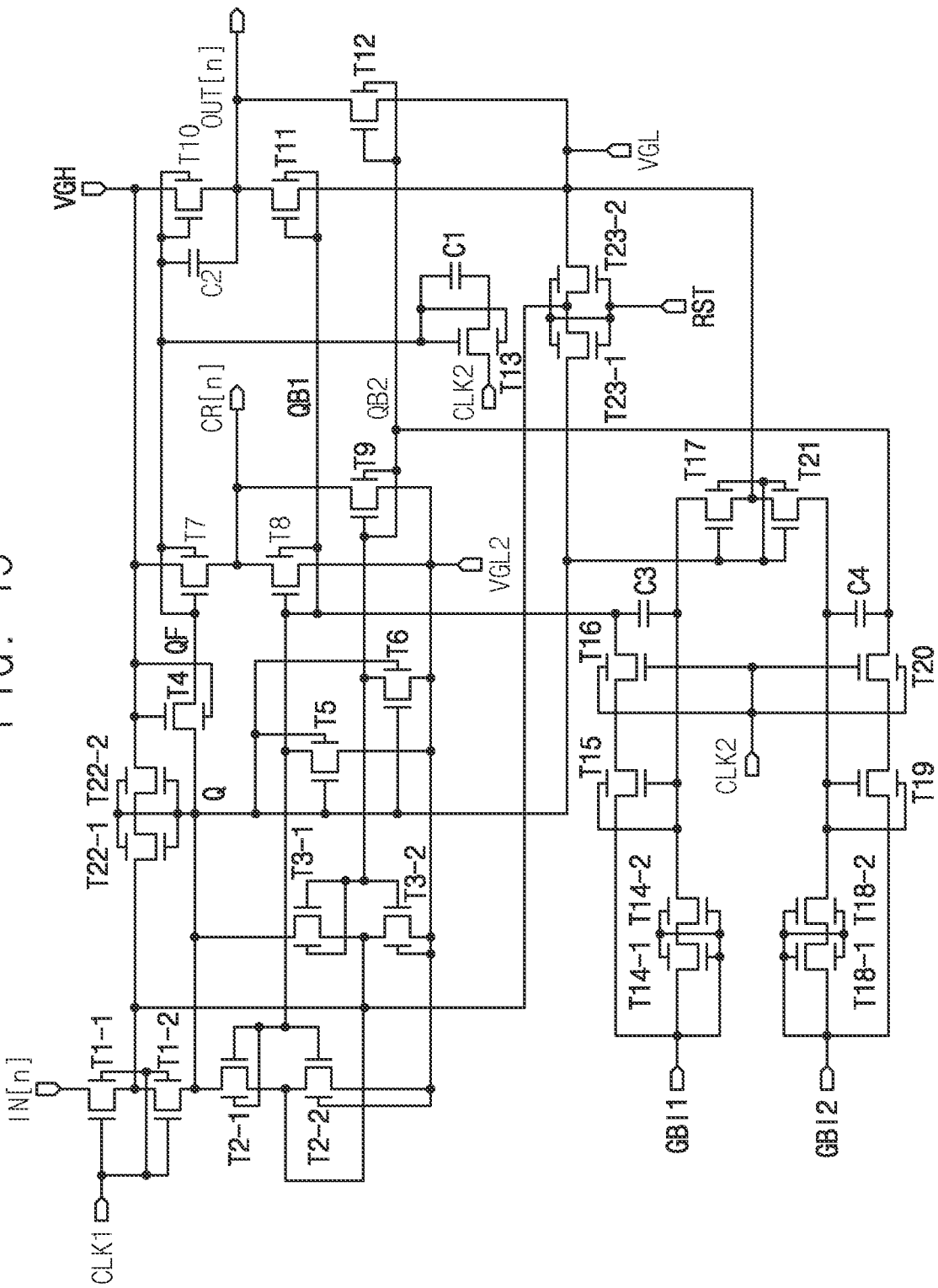
FIG. 19 is a circuit diagram illustrating a stage of a gate driver according to an embodiment of the present invention.

FIG. 19 is a circuit diagram illustrating a stage of a gate driver according to an embodiment of the present invention.

The stage of the gate driver 300 according to the present embodiment is substantially the same as the stage of the gate driver 300 of the previous embodiment illustrated in FIG. 3 except that each of the transistors in the stage of the gate driver 300 further includes a second control electrode. Thus, the same reference numerals will be used to refer to the same or like parts as those described in the previous embodiment of FIGS. 1 to 3 and any repetitive explanation concerning the above elements will be omitted.

Referring to FIG. 19, in the present embodiment, the second control electrode of each of the transistors may be connected to the first control electrode of each of the transistors except for the 2-2 transistor T2-2 and the 3-2 transistor T3-2.

An 1-1 transistor T1-1 may include a first control electrode for receiving the first clock signal CLK1, an input electrode for receiving the input signal IN[n], an output electrode connected to a first intermediate node and a second control electrode for receiving the first clock signal CLK1. An 1-2 transistor T1-2 may include a first control electrode for receiving the first clock signal CLK1, an input electrode connected to the first intermediate node, an output electrode connected to the Q node and a second control electrode for receiving the first clock signal CLK1.

A 2-1 transistor T2-1 may include a first control electrode connected to the QB1 node, an input electrode connected to a second intermediate node, an output electrode connected to the Q node and a second control electrode connected to the QB1 node. A 2-2 transistor T2-2 may include a first control electrode connected to the QB1 node, an input electrode for receiving the second low voltage VGL2, an output electrode connected to the second intermediate node and a second control electrode for receiving the second low voltage VGL2. The second low voltage VGL2 is applied to the second control electrode of the 2-2 transistor T2-2 so that a threshold voltage of the 2-2 transistor T2-2 may be positively shifted and accordingly, the leakage of the 2-2 transistor T2-2 may be reduced. In addition, when the second low voltage VGL2 is applied to the second control electrode of the 2-2 transistor T2-2, a turn-off characteristic of the 2-2 transistor T2-2 may be effectively enhanced.

A 3-1 transistor T3-1 may include a first control electrode connected to the QB2 node, an input electrode connected to a third intermediate node, an output electrode connected to the Q node and a second control electrode connected to the QB2 node. A 3-2 transistor T3-2 may include a first control electrode connected to the QB2 node, an input electrode for receiving the second low voltage VGL2, an output electrode connected to the third intermediate node and a second control electrode for receiving the second low voltage VGL2. The second low voltage VGL2 is applied to the second control electrode of the 3-2 transistor T3-2 so that a threshold voltage of the 3-2 transistor T3-2 may be positively shifted and accordingly, the leakage of the 3-2 transistor T3-2 may be reduced. In addition, when the second low voltage VGL2 is applied to the second control electrode of the 3-2 transistor T3-2, a turn-off characteristic of the 3-2 transistor T3-2 may be effectively enhanced.

The fourth transistor T4 may include a first control electrode for receiving the high voltage VGH, an input electrode connected to the Q node, an output electrode connected to the QF node and a second control electrode for receiving the high voltage VGH. The second control electrode of the fourth transistor T4 is connected to the first control electrode of the fourth transistor T4 so that a turn-on characteristic and a turn-off characteristic of the fourth transistor T4 may be effectively enhanced and a resistance of the fourth transistor T4 may be decreased.

In the previous embodiment of FIG. 3, all of the transistors in the stage of the gate driver 300 are three-terminal elements. In the present embodiment of FIG. 19, all of the transistors in the stage of the gate driver 300 are four-terminal elements. In the present invention, some transistors in the stage of the gate driver 300 may be configured as the three-terminal elements, and some transistors may be configured as the four-terminal elements. When the transistor is configured as the four-terminal element, a second control electrode of the four-terminal element may be connected to a first control electrode of the four-terminal element. Alternatively, when the transistor is configured as the four-terminal element, a second control electrode of the four-terminal element may be connected to an input electrode or an output electrode of the four-terminal element. For example, the first low voltage VGL may be applied to the second control electrode of the four-terminal element. For example, the second low voltage VGL2 may be applied to the second control electrode of the four-terminal element.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

Except for the 2-2 transistor T2-2 and the 3-2 transistor T3-2, the second control electrode of each of the transistors is connected to the first control electrode of each of the transistors so that the turn-on characteristic and the turn-off characteristic of each of the transistors may be effectively enhanced. In addition, the second low voltage VGL2 is applied to the second control electrodes of the 2-2 transistor T2-2 and the 3-2 transistor T3-2 so that the leakage of the 2-2 transistor T2-2 and the 3-2 transistor T3-2 may be reduced.

Figure 20:
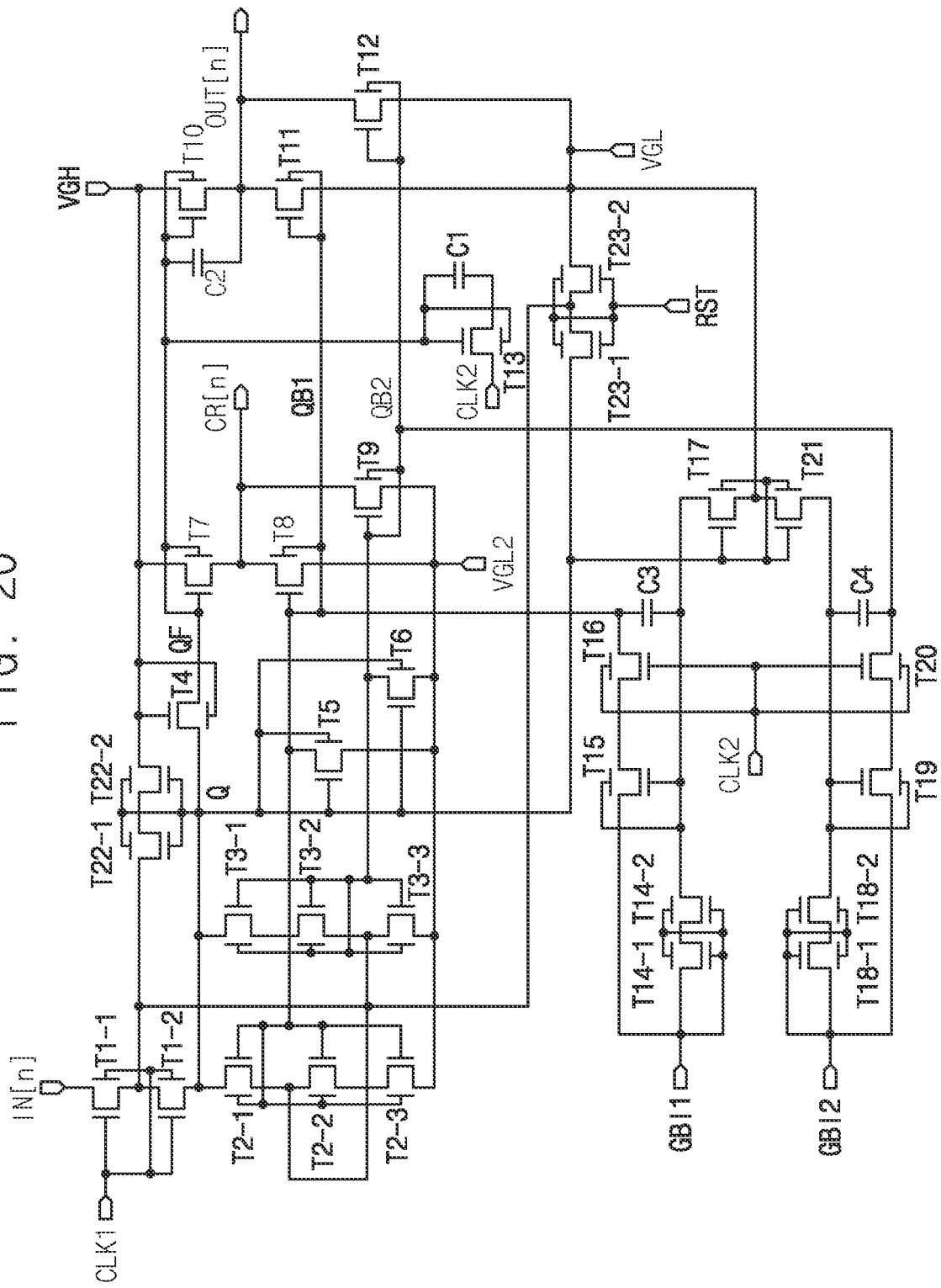
FIG. 20 is a circuit diagram illustrating a stage of a gate driver according to an embodiment of the present invention.

FIG. 20 is a circuit diagram illustrating a stage of a gate driver according to an embodiment of the present invention.

The stage of the gate driver 300 according to the present embodiment is substantially the same as the stage of the gate driver 300 of the previous embodiment illustrated in FIG. 19 except that the stage of the gate driver 300 further includes a 2-3 transistor T2-3 and a 3-3 transistor T3-3. Thus, the same reference numerals will be used to refer to the same or like parts as those described in the previous embodiment of FIG. 19 and any repetitive explanation concerning the above elements will be omitted.

Referring to FIG. 20, a second control electrode of each of the transistors of the stage may be connected to a first control electrode of each of the transistors of the stage.

In the present embodiment, the first Q node control circuit may include a 2-1 transistor T2-1, a 2-2 transistor T2-2 and the 2-3 transistor T2-3.

The 2-1 transistor T2-1 may include a first control electrode connected to the QB1 node, an input electrode connected to a 2-1 intermediate node, an output electrode connected to the Q node and a second control electrode connected to the QB1 node.

The 2-2 transistor T2-2 may include a first control electrode connected to the QB1 node, an input electrode connected to a 2-2 intermediate node, an output electrode connected to the 2-1 intermediate node and a second control electrode connected to the QB1 node.

The 2-3 transistor T2-3 may include a first control electrode connected to the QB1 node, an input electrode for receiving the second low voltage VGL2, an output electrode connected to the 2-2 intermediate node and a second control electrode connected to the QB1 node.

In the present embodiment, the first Q node control circuit may include the three transistors T2-1, T2-2 and T2-3 to prevent a leakage of the first Q node control circuit.

In the present embodiment, the second Q node control circuit may include a 3-1 transistor T3-1, a 3-2 transistor T3-2 and the 3-3 transistor T3-3.

The 3-1 transistor T3-1 may include a first control electrode connected to the QB2 node, an input electrode connected to a 3-1 intermediate node, an output electrode connected to the Q node and a second control electrode connected to the QB2 node.

The 3-2 transistor T3-2 may include a first control electrode connected to the QB2 node, an input electrode connected to a 3-2 intermediate node, an output electrode connected to the 3-1 intermediate node and a second control electrode connected to the QB2 node.

The 3-3 transistor T3-3 may include a first control electrode connected to the QB2 node, an input electrode for receiving the second low voltage VGL2, an output electrode connected to the 3-2 intermediate node and a second control electrode connected to the QB2 node.

In the present embodiment, the second Q node control circuit may include the three transistors T3-1, T3-2 and T3-3 to prevent a leakage of the second Q node control circuit.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

The second control electrode of each of the transistors is connected to the first control electrode of each of the transistors so that the turn-on characteristic and the turn-off characteristic of each of the transistors may be effectively enhanced.

Figure 21:
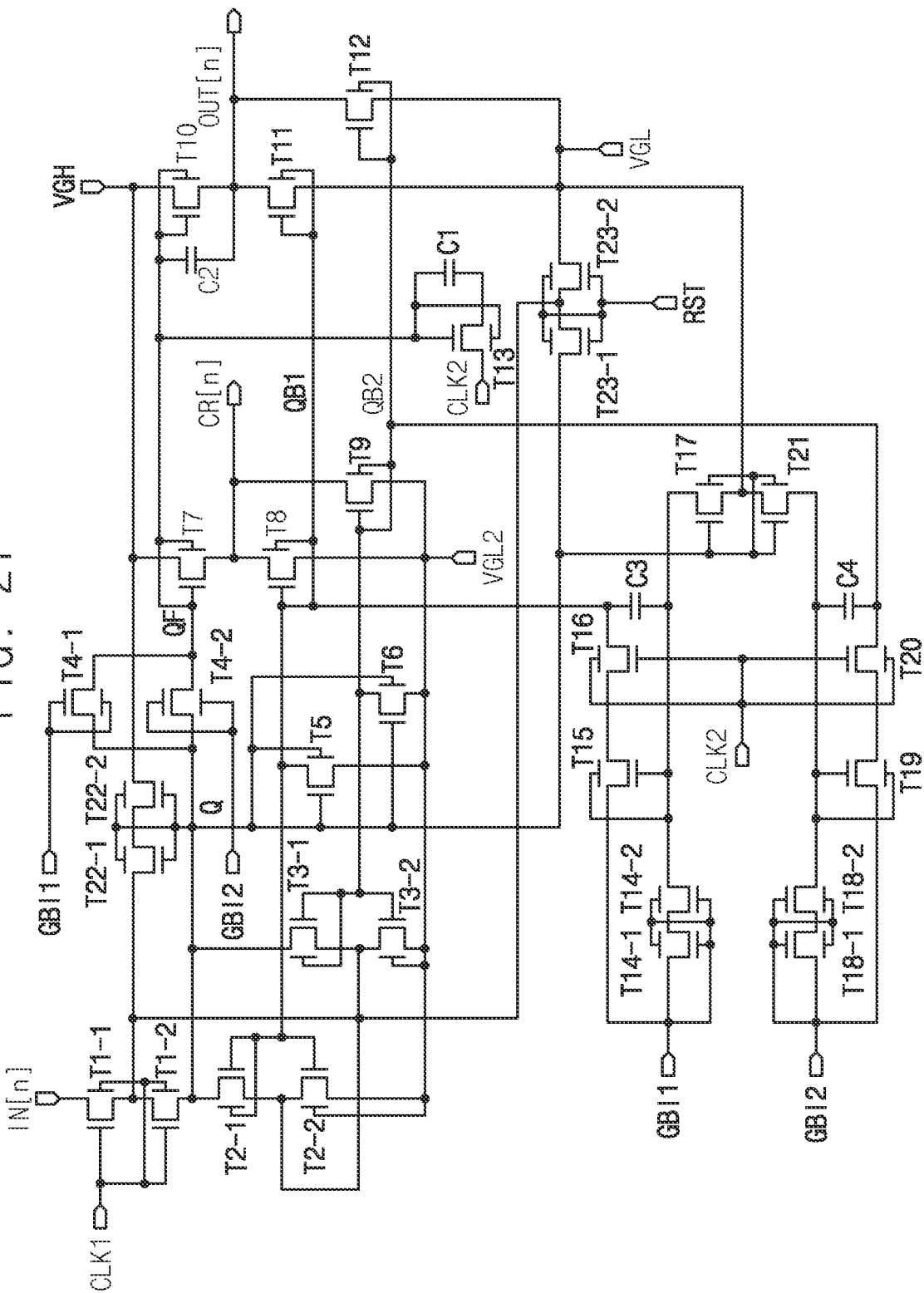
FIG. 21 is a circuit diagram illustrating a stage of a gate driver according to an embodiment of the present invention.

FIG. 21 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 19 except that the stage of the gate driver 300 includes a 4-1 transistor and a 4-2 transistor instead of the fourth transistor T4. Thus, the same reference numerals will be used to refer to the same or like parts as those described in the previous embodiment of FIG. 19 and any repetitive explanation concerning the above elements will be omitted.

Referring to FIG. 21, in the present embodiment, a second control electrode of each of the transistors of the stage may be connected to a first control electrode of each of the transistors of the stage except for the 2-2 transistor T2-2 and the 3-2 transistor T3-2.

The 2-1 transistor T2-1 may include a first control electrode connected to the QB1 node, an input electrode connected to a second intermediate node, an output electrode connected to the Q node and a second control electrode connected to the QB1 node. The 2-2 transistor T2-2 may include a first control electrode connected to the QB1 node, an input electrode for receiving the second low voltage VGL2, an output electrode connected to the second intermediate node and a second control electrode for receiving the second low voltage VGL2. The second low voltage VGL2 is applied to the second control electrode of the 2-2 transistor T2-2 so that a threshold voltage of the 2-2 transistor T2-2 may be positively shifted and accordingly, the leakage of the 2-2 transistor T2-2 may be reduced. In addition, when the second low voltage VGL2 is applied to the second control electrode of the 2-2 transistor T2-2, a turn-off characteristic of the 2-2 transistor T2-2 may be effectively enhanced.

The 3-1 transistor T3-1 may include a first control electrode connected to the QB2 node, an input electrode connected to a third intermediate node, an output electrode connected to the Q node and a second control electrode connected to the QB2 node. The 3-2 transistor T3-2 may include a first control electrode connected to the QB2 node, an input electrode for receiving the second low voltage VGL2, an output electrode connected to the third intermediate node and a second control electrode for receiving the second low voltage VGL2. The second low voltage VGL2 is applied to the second control electrode of the 3-2 transistor T3-2 so that a threshold voltage of the 3-2 transistor T3-2 may be positively shifted and accordingly, the leakage of the 3-2 transistor T3-2 may be reduced. In addition, when the second low voltage VGL2 is applied to the second control electrode of the 3-2 transistor T3-2, a turn-off characteristic of the 3-2 transistor T3-2 may be effectively enhanced.

The 4-1 transistor T4-1 may include a first control electrode for receiving the first selection signal GBI1, an input electrode connected to the Q node and an output electrode connected to the QF node. The 4-1 transistor T4-1 may further include a second control electrode for receiving the first selection signal GBI1. The second control electrode of the 4-1 transistor T4-1 is connected to the first control electrode of the 4-1 transistor T4-1 so that a turn-on characteristic and a turn-off characteristic of the 4-1 transistor T4-1 may be effectively enhanced and a resistance of the 4-1 transistor T4-1 may be decreased.

The 4-2 transistor T4-2 may include a first control electrode for receiving the second selection signal GBI2, an input electrode connected to the Q node and an output electrode connected to the QF node. The 4-2 transistor T4-2 may further include a second control electrode for receiving the second selection signal GBI2. The second control electrode of the 4-2 transistor T4-2 is connected to the first control electrode of the 4-2 transistor T4-2 so that a turn-on characteristic and a turn-off characteristic of the 4-2 transistor T4-2 may be effectively enhanced and a resistance of the 4-2 transistor T4-2 may be decreased.

The 4-1 transistor T4-1 and the 4-2 transistor T4-2 may alternately operate in a unit of a frame in response to the first selection signal GBI1 and the second selection signal GBI2 so that the reliability of the gate driver 300 may be effectively enhanced.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

Except for the 2-2 transistor T2-2 and the 3-2 transistor T3-2, the second control electrode of each of the transistors is connected to the first control electrode of each of the transistors so that the turn-on characteristic and the turn-off characteristic of each of the transistors may be effectively enhanced. In addition, the second low voltage VGL2 is applied to the second control electrodes of the 2-2 transistor T2-2 and the 3-2 transistor T3-2 so that the leakage of the 2-2 transistor T2-2 and the 3-2 transistor T3-2 may be reduced.

Figure 22:
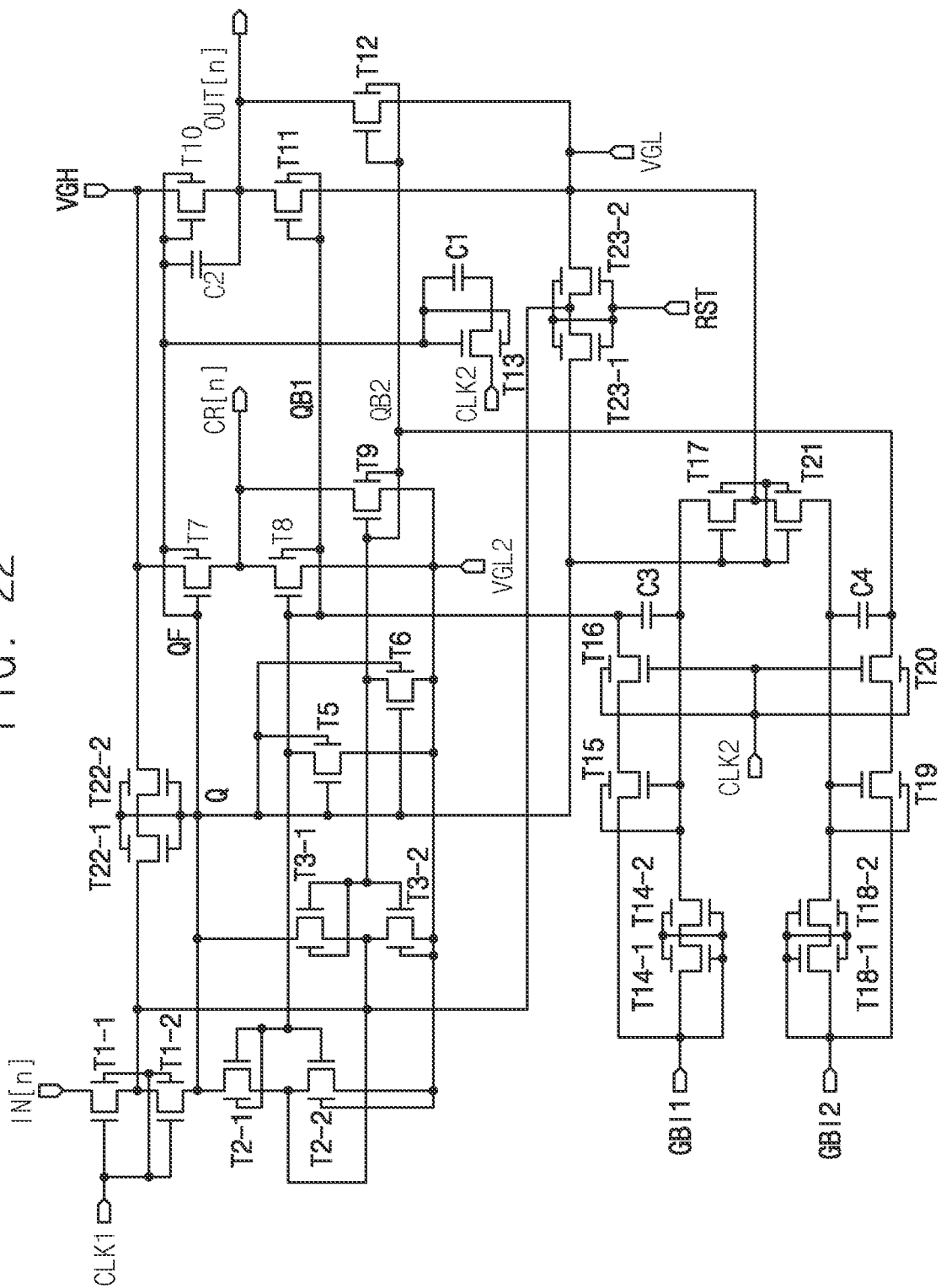
FIG. 22 is a circuit diagram illustrating a stage of a gate driver according to an embodiment of the present invention.

FIG. 22 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 19 except that the stage of the gate driver 300 does not include the fourth transistor T4. Thus, the same reference numerals will be used to refer to the same or like parts as those described in the previous embodiment of FIG. 19 and any repetitive explanation concerning the above elements will be omitted.

The high voltage VGH is constantly applied to the first control electrode of the fourth transistor T4 of FIG. 19 so that a threshold voltage of the fourth transistor T4 of FIG. 19 may be positively shifted and accordingly, the fourth transistor T4 of FIG. 19 may not normally operate. Thus, in the present embodiment of FIG. 22, the fourth transistor T4 may be removed to enhance a reliability of the gate driver 300. Therefore, in the present embodiment, the Q node may be same as the QF node. However, in this case, the capacitance of the second capacitor C2 may need to be sufficiently large for the reliability of the gate driver 300.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

Except for the 2-2 transistor T2-2 and the 3-2 transistor T3-2, the second control electrode of each of the transistors is connected to the first control electrode of each of the transistors so that the turn-on characteristic and the turn-off characteristic of each of the transistors may be effectively enhanced. In addition, the second low voltage VGL2 is applied to the second control electrodes of the 2-2 transistor T2-2 and the 3-2 transistor T3-2 so that the leakage of the 2-2 transistor T2-2 and the 3-2 transistor T3-2 may be reduced.

Figure 23:
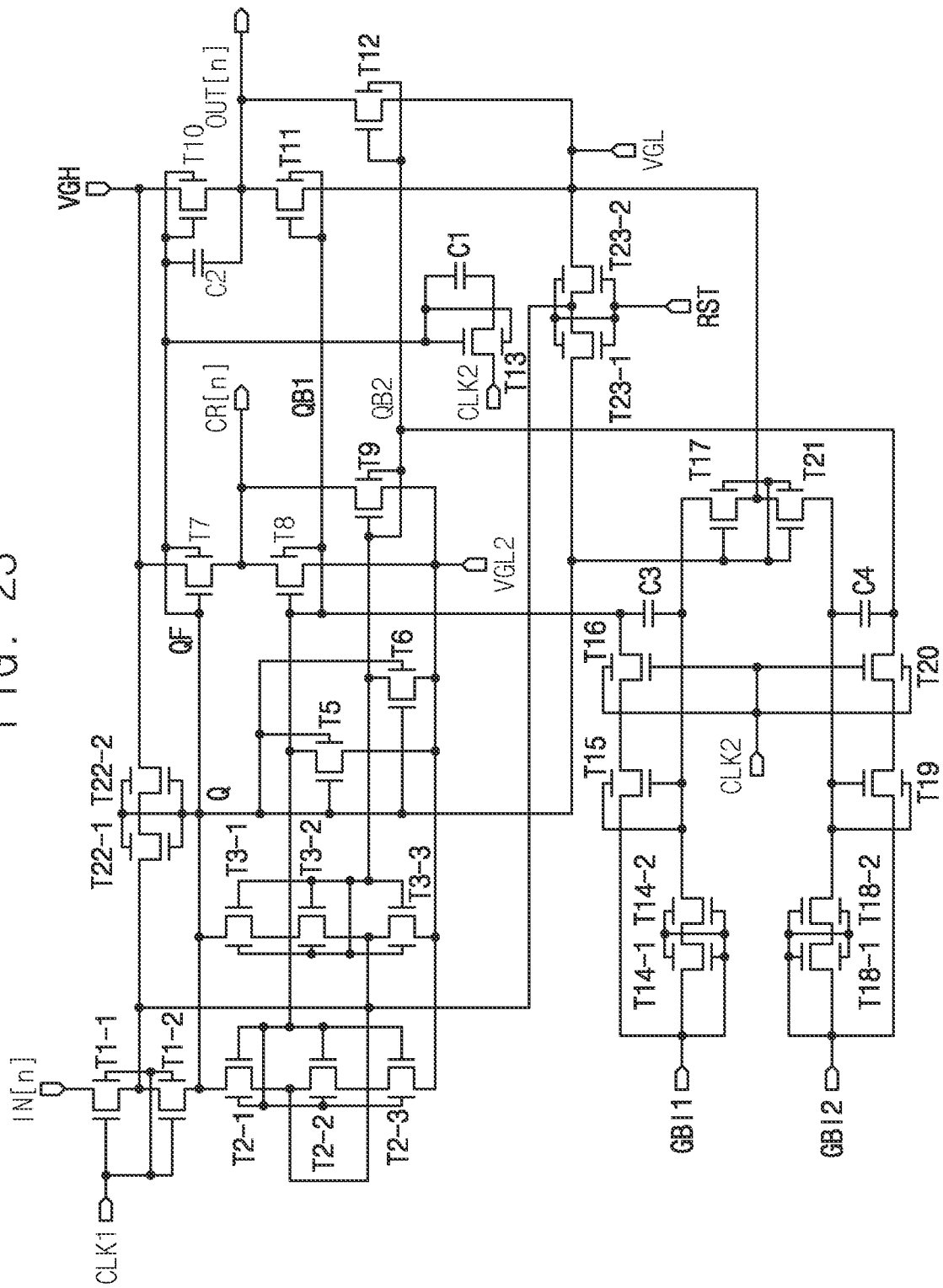
FIG. 23 is a circuit diagram illustrating a stage of a gate driver according to an embodiment of the present invention.

FIG. 23 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 20 except that the stage of the gate driver 300 does not include the fourth transistor T4. Thus, the same reference numerals will be used to refer to the same or like parts as those described in the previous embodiment of FIG. 20 and any repetitive explanation concerning the above elements will be omitted.

The high voltage VGH is constantly applied to the first control electrode of the fourth transistor T4 of FIG. 20 so that a threshold voltage of the fourth transistor T4 of FIG. may be positively shifted and accordingly, the fourth transistor T4 of FIG. 20 may not normally operate. Thus, in the present embodiment of FIG. 23, the fourth transistor T4 may be removed to enhance a reliability of the gate driver 300. Therefore, in the present embodiment, the Q node may be same as the QF node. However, in this case, the capacitance of the second capacitor C2 may need to be sufficiently large for the reliability of the gate driver 300.

In the present embodiment, the first Q node control circuit may include the three transistors T2-1, T2-2 and T2-3 to prevent a leakage of the first Q node control circuit.

In the present embodiment, the second Q node control circuit may include the three transistors T3-1, T3-2 and T3-3 to prevent a leakage of the second Q node control circuit.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

The second control electrode of each of the transistors is connected to the first control electrode of each of the transistors so that the turn-on characteristic and the turn-off characteristic of each of the transistors may be effectively enhanced.

Figure 24:
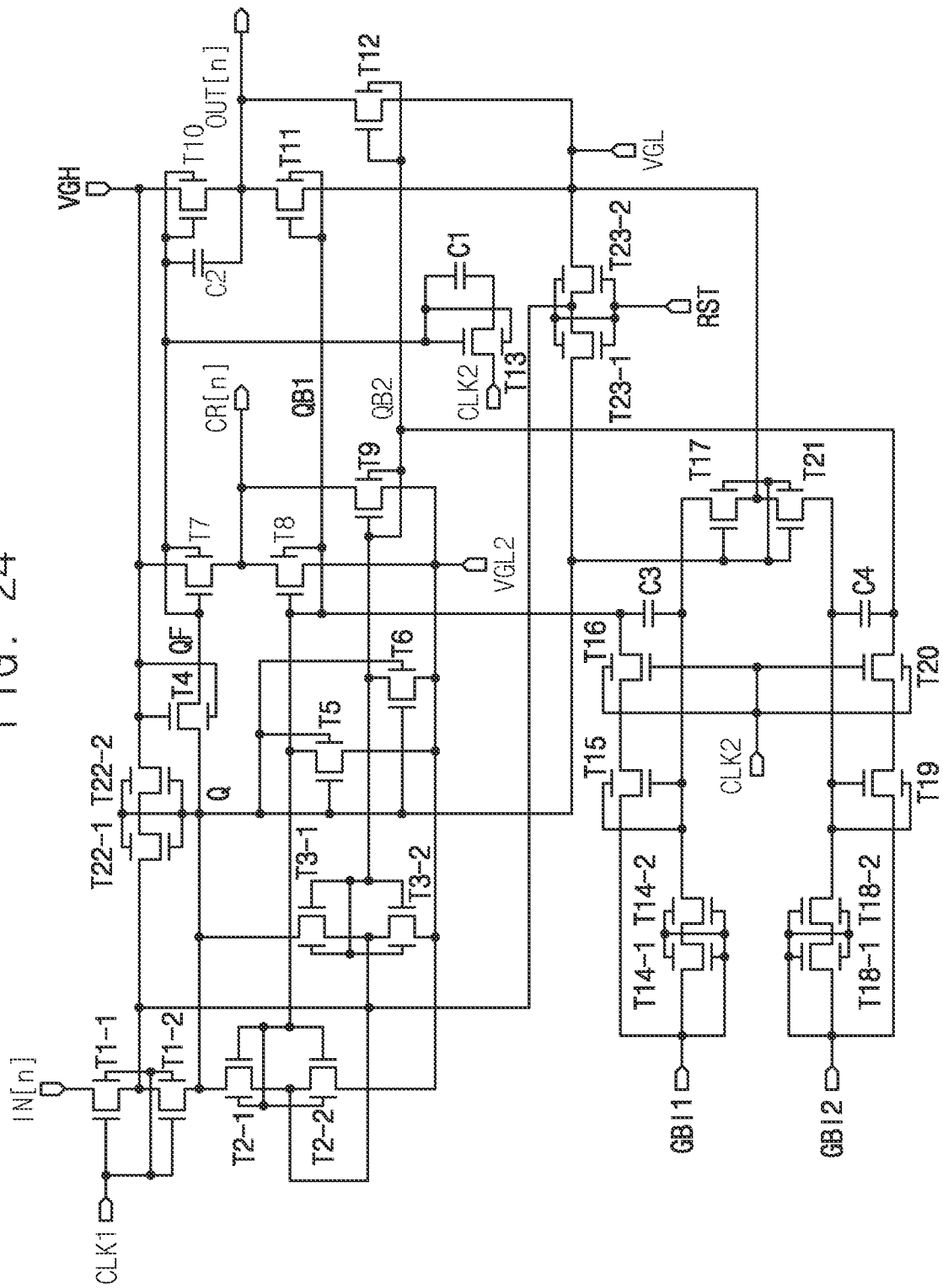
FIG. 24 is a circuit diagram illustrating a stage of a gate driver according to an embodiment of the present invention.

FIG. 24 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 19 except that the second control electrode of the 2-2 transistor T2-2 is connected to the first control electrode of the 2-2 transistor T2-2, and the second control electrode of the 3-2 transistor T3-2 is connected to the first control electrode of the 3-2 transistor T3-2. Thus, the same reference numerals will be used to refer to the same or like parts as those described in the previous embodiment of FIG. 19 and any repetitive explanation concerning the above elements will be omitted.

Referring to FIG. 24, a second control electrode of each of the transistors of the stage may be connected to a first control electrode of each of the transistors of the stage.

The 2-1 transistor T2-1 may include a first control electrode connected to the QB1 node, an input electrode connected to a second intermediate node, an output electrode connected to the Q node and a second control electrode connected to the QB1 node. The 2-2 transistor T2-2 may include a first control electrode connected to the QB1 node, an input electrode for receiving the second low voltage VGL2, an output electrode connected to the second intermediate node and a second control electrode connected to the QB1 node.

The 3-1 transistor T3-1 may include a first control electrode connected to the QB2 node, an input electrode connected to a third intermediate node, an output electrode connected to the Q node and a second control electrode connected to the QB2 node. The 3-2 transistor T3-2 may include a first control electrode connected to the QB2 node, an input electrode for receiving the second low voltage VGL2, an output electrode connected to the third intermediate node and a second control electrode connected to the QB2 node.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

The second control electrode of each of the transistors is connected to the first control electrode of each of the transistors so that the turn-on characteristic and the turn-off characteristic of each of the transistors may be effectively enhanced.

Figure 25:
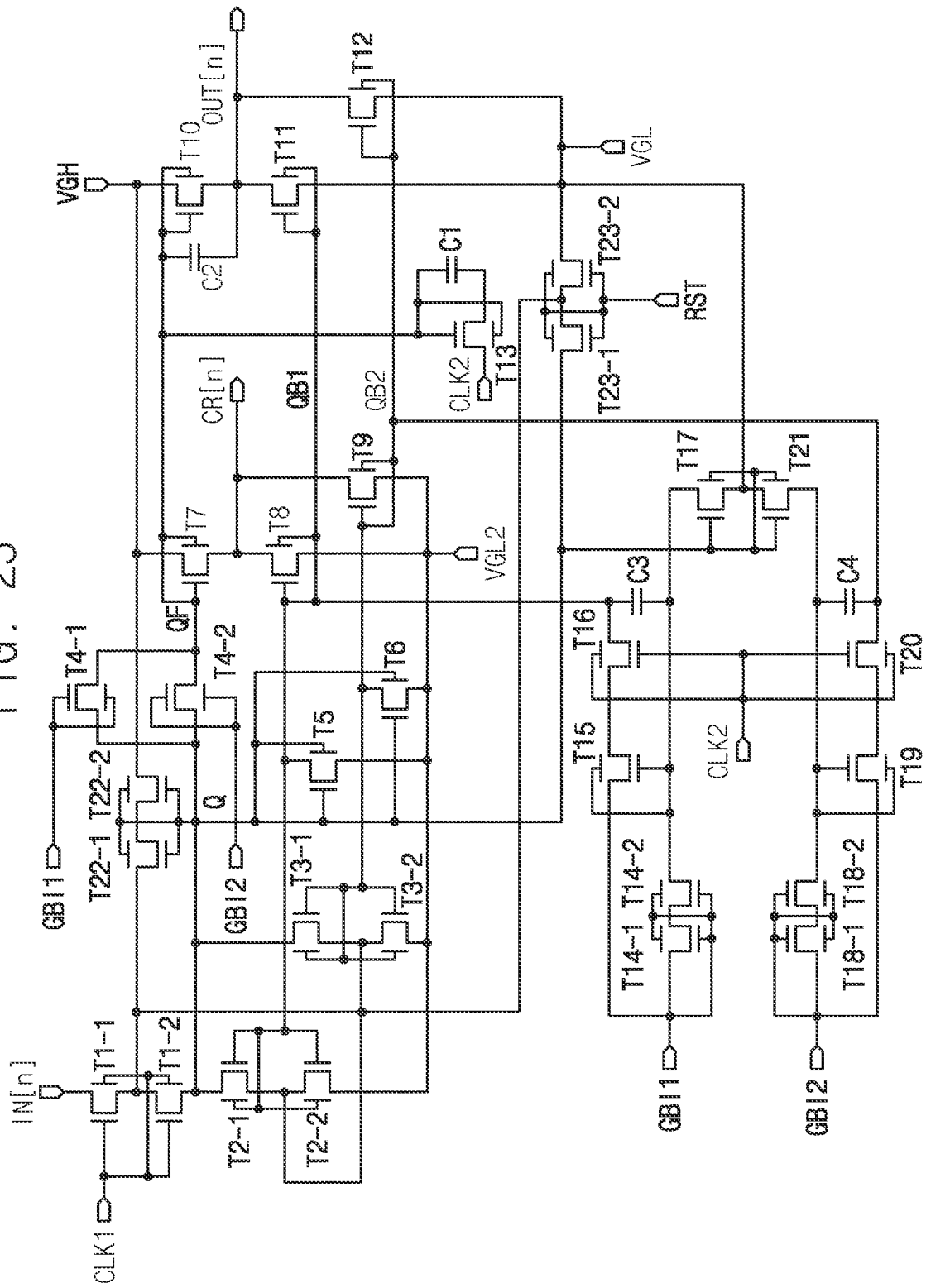
FIG. 25 is a circuit diagram illustrating a stage of a gate driver according to an embodiment of the present invention.

FIG. 25 is a circuit diagram illustrating a stage of a gate driver 300 according to an embodiment of the present invention.

The stage of the gate driver 300 according to the present embodiment is substantially the same as the stage of the gate driver 300 of the previous embodiment illustrated in FIG. 21 except that the second control electrode of the 2-2 transistor T2-2 is connected to the first control electrode of the 2-2 transistor T2-2, and the second control electrode of the 3-2 transistor T3-2 is connected to the first control electrode of the 3-2 transistor T3-2. Thus, the same reference numerals will be used to refer to the same or like parts as those described in the previous embodiment of FIG. 21 and any repetitive explanation concerning the above elements will be omitted.

Referring to FIG. 25, a second control electrode of each of the transistors of the stage may be connected to a first control electrode of each of the transistors of the stage.

The 2-1 transistor T2-1 may include a first control electrode connected to the QB1 node, an input electrode connected to a second intermediate node, an output electrode connected to the Q node and a second control electrode connected to the QB1 node. The 2-2 transistor T2-2 may include a first control electrode connected to the QB1 node, an input electrode for receiving the second low voltage VGL2, an output electrode connected to the second intermediate node and a second control electrode connected to the QB1 node.

The 3-1 transistor T3-1 may include a first control electrode connected to the QB2 node, an input electrode connected to a third intermediate node, an output electrode connected to the Q node and a second control electrode connected to the QB2 node. The 3-2 transistor T3-2 may include a first control electrode connected to the QB2 node, an input electrode for receiving the second low voltage VGL2, an output electrode connected to the third intermediate node and a second control electrode connected to the QB2 node.

The 4-1 transistor T4-1 may include a first control electrode for receiving the first selection signal GBI1, an input electrode connected to the Q node and an output electrode connected to the QF node. The 4-1 transistor T4-1 may further include a second control electrode for receiving the first selection signal GBI1. The second control electrode of the 4-1 transistor T4-1 is connected to the first control electrode of the 4-1 transistor T4-1 so that a turn-on characteristic and a turn-off characteristic of the 4-1 transistor T4-1 may be effectively enhanced and a resistance of the 4-1 transistor T4-1 may be decreased.

The 4-2 transistor T4-2 may include a first control electrode for receiving the second selection signal GBI2, an input electrode connected to the Q node and an output electrode connected to the QF node. The 4-2 transistor T4-2 may further include a second control electrode for receiving the second selection signal GBI2. The second control electrode of the 4-2 transistor T4-2 is connected to the first control electrode of the 4-2 transistor T4-2 so that a turn-on characteristic and a turn-off characteristic of the 4-2 transistor T4-2 may be effectively enhanced and a resistance of the 4-2 transistor T4-2 may be decreased.

The 4-1 transistor T4-1 and the 4-2 transistor T4-2 may alternately operate in a unit of a frame in response to the first selection signal GBI1 and the second selection signal GBI2 so that the reliability of the gate driver 300 may be effectively enhanced.

According to the present embodiment, all transistors in the gate driver 300 may be configured as the N-type transistors. The gate driver 300 may not include the P-type transistors but include the N-type transistors only.

To prevent the current leakage, the display panel 100 includes the N-type transistors only and the gate driver 300 integrated on the display panel 100 also includes the N-type transistors only so that the manufacturing process may become simplified and the current leakage may be prevented in the gate driver 300. The flicker due to the current leakage may be prevented so that the display quality of the display panel 100 may be effectively enhanced.

In addition, a deterioration of a driving capability of a transistor which outputs a low signal during most of frames may be prevented so that a reliability and a stability of a gate output signal OUT[n] may be effectively enhanced.

In addition, all of the transistors in the gate driver 300 may include the first control electrode, the input electrode, the output electrode and the second control electrode.

The second control electrode of each of the transistors is connected to the first control electrode of each of the transistors so that the turn-on characteristic and the turn-off characteristic of each of the transistors may be effectively enhanced.

According to the display apparatus of the present invention as explained above, the manufacturing process may become simplified and the flicker due to the current leakage may be prevented so that the display quality of the display panel may be effectively enhanced. In addition, the reliability and the stability of the gate output signal may be effectively enhanced.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A gate driver comprising:
a pull-up circuit configured to pull up a gate output signal to a high voltage in response to a signal at a first node;
a first pull-down circuit configured to pull down the gate output signal to a first low voltage in response to a signal at a second node;
a second pull-down circuit configured to pull down the gate output signal to the first low voltage in response to a signal at a third node;
a first selection circuit configured to activate the first pull-down circuit and deactivate the second pull-down circuit based on a first selection signal; and
a second selection circuit configured to activate the second pull-down circuit and deactivate the first pull-down circuit based on a second selection signal,
further comprising a boosting circuit including:
a thirteenth transistor including a control electrode connected to the first node, an input electrode configured to receive a second clock signal and an output electrode connected to a second electrode of a first capacitor; and
the first capacitor including a first electrode directly connected to the first node and the second electrode directly connected to the output electrode of the thirteenth transistor.

2. The gate driver of claim 1, further comprising:
a carry pull-up circuit configured to pull up a carry signal to the high voltage in response to the signal at the first node;
a first carry pull-down circuit configured to pull down the carry signal to a second low voltage in response to the signal at the second node; and
a second carry pull-down circuit configured to pull down the carry signal to the second low voltage in response to the signal at the third node.

3. The gate driver of claim 2, wherein the carry pull-up circuit includes a seventh transistor including a control electrode connected to the first node, an input electrode configured to receive the high voltage and an output electrode connected to a carry output terminal,
wherein the first carry pull-down circuit includes an eighth transistor including a control electrode connected to the second node, an input electrode configured to receive the second low voltage and an output electrode connected to the carry output terminal, and
wherein the second carry pull-down circuit includes a ninth transistor including a control electrode connected to the third node, an input electrode configured to receive the second low voltage and an output electrode connected to the carry output terminal.

4. The gate driver of claim 1, further comprising an input circuit configured to transmit an input signal to a fourth node in response to a first clock signal.

5. The gate driver of claim 4, wherein the input circuit includes:
an 1-1 transistor including a control electrode configured to receive the first clock signal, an input electrode configured to receive the input signal and an output electrode connected to a first intermediate node; and an 1-2 transistor including a control electrode configured to receive the first clock signal, an input electrode connected to the first intermediate node and an output electrode connected to the fourth node.

6. The gate driver of claim 4, further comprising a fourth transistor including a first control electrode configured to receive the high voltage, an input electrode connected to the fourth node and an output electrode connected to the first node.

7. The gate driver of claim 6, wherein the fourth transistor further includes a second control electrode configured to receive the high power voltage.

8. The gate driver of claim 4, further comprising:
a 4-1 transistor including a first control electrode configured to receive the first selection signal, an input electrode connected to the fourth node, an output electrode connected to the first node and a second control electrode configured to receive the first selection signal; and
a 4-2 transistor including a first control electrode configured to receive the second selection signal, an input electrode connected to the fourth node, an output electrode connected to the first node and a second control electrode configured to receive the second selection signal.

9. The gate driver of claim 1, further comprising a first fourth-node control circuit configured to apply a second low voltage to a fourth node in response to the signal at the second node.

10. The gate driver of claim 9, wherein the first fourth-node control circuit includes:
a 2-1 transistor including a first control electrode connected to the second node, an input electrode connected to a second intermediate node and an output electrode connected to the fourth node; and
a 2-2 transistor including a first control electrode connected to the second node, an input electrode configured to receive the second low voltage and an output electrode connected to the second intermediate node.

11. The gate driver of claim 10, wherein the 2-1 transistor further includes a second control electrode connected to the second node, and
wherein the 2-2 transistor further includes a second control electrode configured to receive the second low voltage.

12. The gate driver of claim 10, wherein the 2-1 transistor further includes a second control electrode connected to the second node, and
wherein the 2-2 transistor further includes a second control electrode connected to the second node.

13. The gate driver of claim 9, wherein the first fourth-node control circuit includes:
a 2-1 transistor including a first control electrode connected to the second node, an input electrode connected to a 2-1 intermediate node, an output electrode connected to the fourth node and a second control electrode connected to the second node;
a 2-2 transistor including a first control electrode connected to the second node, an input electrode connected to a 2-2 intermediate node, an output electrode connected to the 2-1 intermediate node and a second control electrode connected to the second node; and
a 2-3 transistor including a first control electrode connected to the second node, an input electrode configured to receive the second low voltage, an output electrode connected to the 2-2 intermediate node and a second control electrode connected to the second node.

14. The gate driver of claim 1, further comprising a second fourth-node control circuit configured to apply a second low voltage to a fourth node in response to the signal at the third node.

15. The gate driver of claim 14, wherein the second fourth-node control circuit includes:
a 3-1 transistor including a first control electrode connected to the third node, an input electrode connected to a third intermediate node and an output electrode connected to the fourth node; and
a 3-2 transistor including a first control electrode connected to the third node, an input electrode configured to receive the second low voltage and an output electrode connected to the third intermediate node.

16. The gate driver of claim 15, wherein the 3-1 transistor further includes a second control electrode connected to the third node, and
wherein the 3-2 transistor further includes a second control electrode configured to receive the second low voltage.

17. The gate driver of claim 15, wherein the 3-1 transistor further includes a second control electrode connected to the third node, and
wherein the 3-2 transistor further includes a second control electrode connected to the third node.

18. The gate driver of claim 14, wherein the first fourth-node control circuit includes:
a 3-1 transistor including a first control electrode connected to the third node, an input electrode connected to a 3-1 intermediate node, an output electrode connected to the fourth node and a second control electrode connected to the third node;
a 3-2 transistor including a first control electrode connected to the third node, an input electrode connected to a 3-2 intermediate node, an output electrode connected to the 3-1 intermediate node and a second control electrode connected to the third node; and
a 3-3 transistor including a first control electrode connected to the third node, an input electrode configured to receive the second low voltage, an output electrode connected to the 3-2 intermediate node and a second control electrode connected to the third node.

19. The gate driver of claim 1, further comprising a fifth transistor configured to apply a second low voltage to the second node in response to a signal at a fourth node.

20. The gate driver of claim 1, further comprising a sixth transistor configured to apply a second low voltage to the third node in response to a signal at a fourth node.

21. The gate driver of claim 1, further comprising a reset circuit configured to apply the first low voltage to a fourth node in response to a reset signal.

22. The gate driver of claim 21, wherein the reset circuit includes:
a 23-2 transistor including a control electrode configured to receive the reset signal, an input electrode configured to receive the first low voltage and an output electrode connected to a twenty third intermediate node; and
a 23-1 transistor including a control electrode configured to receive the reset signal, an input electrode connected to the twenty third intermediate node and an output electrode connected to the fourth node.

23. The gate driver of claim 1, wherein the pull-up circuit includes:
a tenth transistor including a control electrode connected to the first node, an input electrode configured to receive the high voltage and an output electrode connected to a gate output terminal; and
a second capacitor connected to the control electrode of the tenth transistor and the output electrode of the tenth transistor.

24. The gate driver of claim 1, wherein the second selection circuit includes:
a 18-1 transistor including a control electrode configured to receive the second selection signal, an input electrode configured to receive the second selection signal and an output electrode connected to an eighteenth intermediate node;
a 18-2 transistor including a control electrode configured to receive the second selection signal, an input electrode connected to the eighteenth intermediate node and an output electrode connected to a control electrode of a nineteenth transistor;
the nineteenth transistor including the control electrode connected to the output electrode of the 18-2 transistor, an input electrode configured to receive the second selection signal and an output electrode connected to an input electrode of a twentieth transistor; and
the twentieth transistor including a control electrode configured to receive a second clock signal, the input electrode connected to the output electrode of the nineteenth transistor and an output electrode connected to the third node.

25. The gate driver of claim 24, wherein the second selection circuit further includes a fourth capacitor including a first electrode connected to the control electrode of the nineteenth transistor and a second electrode connected to the third node.

26. The gate driver of claim 1, further comprising:
an 1-1 transistor including a control electrode configured to receive a first clock signal, an input electrode configured to receive an input signal and an output electrode connected to a first intermediate node;
an 1-2 transistor including a control electrode configured to receive the first clock signal, an input electrode connected to the first intermediate node and an output electrode connected to a fourth node;
a 2-1 transistor including a control electrode connected to the second node, an input electrode connected to a second intermediate node and an output electrode connected to the fourth node;
a 2-2 transistor including a control electrode connected to the second node, an input electrode configured to receive a second low voltage and an output electrode connected to the second intermediate node;
a 3-1 transistor including a control electrode connected to the third node, an input electrode connected to a third intermediate node and an output electrode connected to the fourth node;
a 3-2 transistor including a control electrode connected to the third node, an input electrode configured to receive the second low voltage, an output electrode connected to the third intermediate node; and
a stabilizing circuit configured to apply the high voltage to the first intermediate node, the second intermediate node and the third intermediate node in response to a signal at the fourth node.

27. The gate driver of claim 26, wherein the stabilizing circuit includes:
a 22-1 transistor including a control electrode connected to the fourth node, an input electrode connected to a twenty second intermediate node and an output electrode connected to the first intermediate node, the second intermediate node and the third intermediate node; and
a 22-2 transistor including a control electrode connected to the fourth node, an input electrode configured to receive the high voltage and an output electrode connected to the twenty second intermediate node.

28. The gate driver of claim 1, further comprising a boosting circuit configured to boost the signal at the first node using a second clock signal in response to the signal at the first node,
wherein the boosting circuit includes:
a thirteenth transistor including a control electrode connected to the first node, an input electrode configured to receive the second clock signal and an output electrode connected to a second electrode of a first capacitor; and
the first capacitor including a first electrode connected to the first node and the second electrode,
further comprising a twenty fourth transistor configured to apply the first low voltage to the output electrode of the thirteenth transistor in response to a first clock signal.

29. The gate driver of claim 1, wherein all of the transistors in the gate driver are N-type transistors.

30. The gate driver of claim 1, wherein the gate output signal is configured to maintain the high voltage for two or more horizontal periods.

31. A gate driver comprising:
a pull-up circuit configured to pull up a gate output signal to a high voltage in response to a signal at a first node;
a first pull-down circuit configured to pull down the gate output signal to a first low voltage in response to a signal at a second node;
a second pull-down circuit configured to pull down the gate output signal to the first low voltage in response to a signal at a third node;
a first selection circuit configured to activate the first pull-down circuit and deactivate the second pull-down circuit based on a first selection signal; and
a second selection circuit configured to activate the second pull-down circuit and deactivate the first pull-down circuit based on a second selection signal, wherein the first selection circuit includes:
a 14-1 transistor including a control electrode configured to receive the first selection signal, an input electrode configured to receive the first selection signal and an output electrode connected to a fourteenth intermediate node;
a 14-2 transistor including a control electrode configured to receive the first selection signal, an input electrode connected to the fourteenth intermediate node and an output electrode connected to a control electrode of a fifteenth transistor;
the fifteenth transistor including the control electrode connected to the output electrode of the 14-2 transistor, an input electrode configured to receive the first selection signal and an output electrode connected to an input electrode of a sixteenth transistor; and
the sixteenth transistor including a control electrode configured to receive a second clock signal, the input electrode connected to the output electrode of the fifteenth transistor and an output electrode connected to the second node.

32. The gate driver of claim 31, wherein the first selection circuit further includes a third capacitor including a first electrode connected to the control electrode of the fifteenth transistor and a second electrode connected to the second node.

33. A display apparatus comprising:
a display panel including a pixel;
a gate driver configured to output a gate signal to the pixel;
a data driver configured to output a data voltage to the pixel; and
an emission driver configured to output an emission signal to the pixel,
wherein the gate driver comprises:
- a pull-up circuit configured to pull up a gate output signal to a high voltage in response to a signal at a first node;
- a first pull-down circuit configured to pull down the gate output signal to a low voltage in response to a signal at a second node;
- a second pull-down circuit configured to pull down the gate output signal to the low voltage in response to a signal at a third node;
- a first selection circuit configured to activate the first pull-down circuit and deactivate the second pull-down circuit based on a first selection signal; and
- a second selection circuit configured to activate the second pull-down circuit and deactivate the first pull-down circuit based on a second selection signal, wherein the gate driver further comprises a boosting circuit including:
- a thirteenth transistor including a control electrode connected to the first node, an input electrode configured to receive a second clock signal and an output electrode connected to a second electrode of a first capacitor; and
- the first capacitor including a first electrode directly connected to the first node and the second electrode directly connected to the output electrode of the thirteenth transistor.

* * * * *